US010252456B1

(12) United States Patent
Fossey et al.

(10) Patent No.: US 10,252,456 B1
(45) Date of Patent: *Apr. 9, 2019

(54) METHOD OF MAKING ACTUATORS BASED ON UNBALANCED MOMENTS OF INERTIA

(71) Applicant: The United States of America as Represented by the Secretary of the Army, Washington, DC (US)

(72) Inventors: Stephen A. Fossey, Framingham, MA (US); Barry S. DeCristofano, Plympton, MA (US)

(73) Assignee: The United States of America, as Represented by the Secretary of the Army, Washington, DC (US)

(*) Notice: Subject to any disclaimer, the term of this patent is extended or adjusted under 35 U.S.C. 154(b) by 520 days.

This patent is subject to a terminal disclaimer.

(21) Appl. No.: 14/844,034

(22) Filed: Sep. 3, 2015

Related U.S. Application Data

(63) Continuation-in-part of application No. 13/343,933, filed on Jan. 5, 2012, now Pat. No. 9,163,334.
(Continued)

(51) Int. Cl.
*D01D 5/24* (2006.01)
*D01D 5/253* (2006.01)
(Continued)

(52) U.S. Cl.
CPC .......... *B29C 47/06* (2013.01); *B29C 47/0038* (2013.01); *B29C 65/48* (2013.01);
(Continued)

(58) Field of Classification Search
CPC ............ D01D 5/24; D01D 5/253; D01D 5/32; D01D 5/34; D01F 8/04; D01F 8/06;
(Continued)

(56) References Cited

U.S. PATENT DOCUMENTS

| 3,505,164 A | 4/1970 | Oppenlander |
| 3,509,013 A | 4/1970 | Oppenlander |
| 3,533,904 A | 10/1970 | Jurkiewitsch |
| 3,568,249 A * | 3/1971 | Matsui ................... D01D 5/253 |
| | | 264/172.12 |
| 4,115,620 A | 9/1978 | Gupta et al. |
| 4,211,819 A | 7/1980 | Kunimune et al. |

(Continued)

OTHER PUBLICATIONS

Timoshenko, S., Analysis of Bi-metal Thermostats, 11 (3) J. Opt. Soc. Am., pp. 233-255 (1925).

(Continued)

*Primary Examiner* — Leo B Tentoni
(74) *Attorney, Agent, or Firm* — Roger C. Phillips

(57) ABSTRACT

Methods and computer-readable mediums are provide that, in some embodiments maximize bending of an actuator and, in other embodiments, minimize bending of the actuator. For example, in one embodiment, a method is provided that designs and determines a Ratio1 for a first component. Ratio1 is a modulus of inertia for the first component divided by a Young's Modulus for the first component. Thereafter, a second component is designed that has a Ratio2 substantially equal to the Ratio1 of the first component. Ratio2 is a modulus of inertia for the second component divided by a Young's Modulus for the second component. Thereafter, the first component and the second component can be used to make an actuator that is spun into fiber to make products (e.g., batting material, woven material, a suture, a thermostat needle, a gel, etc.). Other embodiments are provided that utilize computer-readable medium.

10 Claims, 14 Drawing Sheets

Related U.S. Application Data

(60) Provisional application No. 61/563,040, filed on Nov. 23, 2011.

(51) Int. Cl.

| | | |
|---|---|---|
| *D01D 5/32* | (2006.01) | |
| *D01D 5/34* | (2006.01) | |
| *D01F 8/06* | (2006.01) | |
| *D01F 8/08* | (2006.01) | |
| *D01F 8/10* | (2006.01) | |
| *D01F 8/12* | (2006.01) | |
| *D01F 8/14* | (2006.01) | |
| *D01F 8/16* | (2006.01) | |
| *B29C 47/06* | (2006.01) | |
| *B29C 47/00* | (2006.01) | |
| *B29C 65/48* | (2006.01) | |
| *B29C 65/72* | (2006.01) | |
| *G06F 17/50* | (2006.01) | |
| *G06F 17/10* | (2006.01) | |
| *D03D 15/00* | (2006.01) | |
| *B29K 23/00* | (2006.01) | |
| *B29L 9/00* | (2006.01) | |
| *B29L 31/00* | (2006.01) | |

(52) U.S. Cl.
CPC ......... *B29C 65/72* (2013.01); *D03D 15/0027* (2013.01); *G06F 17/10* (2013.01); *G06F 17/50* (2013.01); *B29K 2023/12* (2013.01); *B29K 2995/0012* (2013.01); *B29K 2995/0041* (2013.01); *B29L 2009/00* (2013.01); *B29L 2031/731* (2013.01)

(58) Field of Classification Search
CPC ..... D01F 8/08; D01F 8/10; D01F 8/12; D01F 8/14; D01F 8/16; D03D 15/0027
USPC ...... 264/103, 171.26, 171.28, 172.1, 172.12, 264/172.14, 172.15, 172.17, 172.18
See application file for complete search history.

(56) References Cited

U.S. PATENT DOCUMENTS

| | | | |
|---|---|---|---|
| 4,315,881 | A | 2/1982 | Nakajima et al. |
| 6,312,784 | B2 | 11/2001 | Russell et al. |
| 8,349,438 | B2 | 1/2013 | Laib et al. |
| 8,389,100 | B2 | 3/2013 | Rock et al. |
| 2010/0164478 | A1* | 7/2010 | Miura .............. G01L 1/205 324/109 |
| 2015/0247262 | A1* | 9/2015 | Tallury ............. D01F 8/06 428/373 |

OTHER PUBLICATIONS

Alici, Gursel and Huynh, Nam. N., Predicting Force Output of Trilayer Polymer Actuators, Sensors and Actuators, vol. 132, pp. 616-625 (2006).

Slepyan, L., Ryvkin, M., and Fuchs, M.B., Temperature Insensitive Curved Bimetal Elements, Acta Astronautica, vol. 37, pp. 95-103 (1995).

Fossey, S.A. and Du Plessis, A.J., Variable Loft Thermal Insulation for Temperature Adaptive Clothing, Industrial Fabrics International Association: Safety & Protective Fabrics Proceedings (2004) in Roseville, MN (USA).

Fossey, S.A., Gilbert, D., and Hunt, V., Variable Loft Thermal Insulation (2006) in Atlanta, GA. (USA) for AATCC 2006 International Conference.

Uehara, H., Yamazaki, Y., and Kanamoto, T., Tensile Properties of Highly Syndiotactic Polypropylene, vol. 37, No. 1, pp. 57-64 (1996).

Lacks, D.J. and Rutledge, G.C., Mechanisms for Axial Thermal Contraction in Polymer Crystals: Polyethylene vs Isotactic Polypropylene, Chemical Engineering Science, vol. 49, pp. 2881-2888 (1994).

Fossey, S.A., Decristofano, B.S., Welsh, E.A., Perry, J., and Archambault, D., Temperature Adaptive "Smart" Thermal Insulation Based on Multicomponent Fiber Spinning, (2010) for Army Science Conference in Orlando, Fl. (USA).

Fossey, S.A., Decristofano, B.S., Welsh, E.A., Perry, J., and Archambault, D., Temperature Adaptive Insulation Based on Multi-component Fibers of Various Cross-sections, for 2010 MRS Fall Meeting.

Lacks, Daniel J., Rutledge, Gregory C., 28 Molecular Basis for the Anisotropic Transverse Thermal Expansion of Syndiotactic Polypropylene, Macromolecules, pp. 5789-5792 (1995).

Shapiro, Benjamin and Smela, Elisabeth, Bending Actuators with Maximum Curvature and Force and Zero Interfacial Stress, 18 Journal of Intelligent Material Systems and Structures, pp. 181-186 (2007).

Wang, Qing-Ming and Cross, L. Eric, Performance Analysis of Piezoelectric Cantilever Bending Actuators, Ferroelectrics, vol. 18, pp. 187-213 (1998).

Lovinger, Andrew J., Lotz, Bernard, Davis, Don D., and Padden Jr., F.J., Macromolecules: Structure and Defects in Fully Syndiotactic Polypropylene, vol. 26, pp. 3494-3503 (1993).

Aklonis, J.J., and Macknight, W.J., Introduction to Polymer Viscoelasticity, 2nd Ed., Wiley-Interscience: Transitions and Relaxation in Amorphous Polymers, pp. 57-62 (1983).

Stuart, I.M., and Holcombe, B.V., "Heat Transfer Through Fiber Beds by Radiation with Shading and Conduction", Textile Research Journal, vol. 54, 1984, pp. 149-157.

Farnworth, B., "Mechanisms of Heat Flow Through Clothing Insulation", Textile Research Journal, vol. 53, 1983, pp. 717-724.

Dent, R. W., Donovan, J. G., Skelton, J., and Fossey, S. "Development of Synthetic Down Alternatives", Natick/TR-86/021L, Apr. 1984.

Dent, R. W., Donovan, J. G., Skelton, J., and Fossey, S. "Development of Synthetic Down Alternatives Phase II", Natick/TR-87/004L, Jan. 1986.

Santee, W. R. "A Simplified Modeling Approach for Estimating Heat Loss during Cold Exposure" U. S. Army Research Institute of Environmental Medicine Report 19960805 091, Jun. 1996.

* cited by examiner

Temperature Response of Battings

METHOD OF MAKING ACTUATORS BASED ON UNBALANCED MOMENTS OF INERTIA

CROSS-REFERENCE TO RELATED APPLICATIONS

This application is a continuation-in-part of U.S. patent application Ser. No. 13/343,933 filed on 2015 Jan. 5 which claims benefit under 35 U.S.C. § 119(e) of U.S. Provisional Patent Application No. 61/563,040, filed on Nov. 23, 2011, and is incorporated herein by reference in its entirety.

STATEMENT OF GOVERNMENT INTEREST

The material described herein may be manufactured and used by or for the U.S. Government for governmental purposes without the payment of any royalties thereon or therefor.

BACKGROUND

Field of the Invention

Embodiments of the present invention generally relate to actuators and more specifically to tailoring the moments of inertia of at least two components, of the actuator, to enhance or suppress bending.

Description of the Related Art

It has long been known that two sheets of metal with different coefficients of thermal expansion ("CTE") will bend with changes in temperature. The traditional approach to this technology is illuminated by the "bi-metallic spring." The general relationship for when the two metals (i.e., in a bi-metallic strip) are of the same thickness is analyzed in Timoshenko, S., Analysis of Bi-metal Thermostats, J. Opt. Soc. Am. (1925), 11(2), pp. 233-255 (hereinafter "Timoshenko").

Timoshenko analyzed the bending of a bi-metal thermostat of rectangular cross-section and concluded:

The curvature is proportional to the difference in elongation of the two metals and inversely proportional to the thickness of the strip. It is seen that the magnitude of the ratio [of the Young's moduli of the two metals] does not produce any substantial effect on the curvature of the strip. See Timoshenko at page 235.

A bi-metallic strip 100 is provided in FIG. 1. Specifically, the bi-metallic strip 100 includes a first component 102 and a second component 104. The first component 102 is made of a different metal than the second component 104. The first component 102 and second component 104 have the same dimensions and different coefficients of linear expansion and moments of inertia. Heating the bi-metallic strip 100 causes bending of the bi-metallic strip 100.

Equations are provided below for calculating the temperature of budding, the complete travel during buckling, and the temperature of buckling in a backward direction. By using these equations, the dimensions of the bi-metallic strip 100 for a given temperature of operation and a given complete range of temperature can be calculated. It has long been known that two sheets of metal with different coefficients of thermal expansion ("CTE") will bend with changes in temperature. The general relationship for the two metals (i.e., components 102 and 104) are of the same thickness (as provided by Timoshenko) is provided by Equation 1:

$$\frac{1}{\rho} = \frac{24(\alpha_2 - \alpha_1)(\Delta T)}{h\left(14 + n + \frac{1}{n}\right)} \qquad \text{Equation (1)}$$

where the CTEs of the two materials are $\alpha_1$ (component 102) and $\alpha_2$ (component 104), the change in temperature is $\Delta T$, h is the combined thickness of components 102 and 104, n is the ratio of the mechanical moduli of components 102 and 104, the radius of curvature is $\rho$, and the "curvature" is $$\frac{1}{\rho}.$$

Note that Equation (1) can alternatively be expressed as Equation (2) below.

$$\frac{1}{\rho_{rect}} = \frac{6(\alpha_2 - \alpha_1)(t - t_0)(1 + m)^2}{h\left[3 + (1 + m)^2 + (1 + nm)\left(m^2 + \frac{1}{nm}\right)\right]} \qquad \text{Equation (2)}$$

where $$\frac{1}{\rho_{rect}}$$

is the curvature of the strip 100, h is the height or diameter of the fiber, $\alpha_2$ is the coefficient of thermal expansion for component 104, $\alpha_1$ is the coefficient of thermal expansion for component 102, n is the ratio of the Young's moduli of the components 102 and 104, and m is a ratio of the thickness of components 102 and 104. Note that setting m=1 in Equation (2) yields Equation (1).

According to the analysis in Timoshenko, the bending of the bonded metal sheets (i.e., components 102 and 104 combined) is not a strong function of the mechanical modulus of the component metals. $E_1$ and $E_2$ are the elastic moduli of components 102 and 104, respectively. It is seen that the magnitude of $$n = \frac{E_1}{E_2}$$

does not produce any substantial effect on the curvature of the strip. For example, when n=1, then Equation (1) above is reduced to Equation (3).

$$\frac{1}{\rho} = \frac{3(\alpha_2 - \alpha_1)(\Delta T)}{2h} \qquad \text{Equation (3)}$$

where the CTEs of the two materials are $\alpha_1$ (component 102) and $\alpha_2$ (component 104), the change in temperature is $\Delta T$, h is the combined thickness of components 102 and 104, the radius of curvature is $\rho$, and the "curvature" is $$\frac{1}{\rho}.$$

Similarly, when $$n = \frac{1}{2}$$

or n=2 then Equation (1) is reduced to Equation (4) below.

$$\frac{1}{\rho} = \frac{48(\alpha_2 - \alpha_1)(\Delta T)}{33h} \qquad \text{Equation (4)}$$

where the CTEs of the two materials are $\alpha_1$ (component 102) and $\alpha_2$ (component 104), the change in temperature is $\Delta T$, h is the combined thickness of components 102 and 104, the radius of curvature is $\rho$, and the "curvature" is $$\frac{1}{\rho}.$$

"For a ratio of Young's moduli of 2, the "difference . . . [in curvature] is only about 3 percent." See Timoshenko at page 236.

However, many combinations of materials that could be useful have mechanical moduli which can vary by a factor or ten or more. Based on these same equations the bending would be reduced by about one third. If the mechanical moduli differ by two orders of magnitude the bending is reduced to only 15% of the amount of bending that would be seen in the case where mechanical moduli are equal.

Examples of materials with very different mechanical moduli are polymers above and below their glass transition temperatures. Amorphous polymers above their glass transition temperature (i.e., in a rubbery state) usually have much higher CTEs than those below their glass transition temperature (i.e., in a glassy state) and would make good candidates for bending in response to temperature changes to act as a thermostat or a temperature adaptive insulation. Unfortunately, a decrease in modulus of about 3 orders of magnitude occurs at the glass transition making this combination of materials essentially useless.

Many materials of current technological interest such as gels, amorphous metals, shape memory polymers, and nanocomposites have mechanical moduli which vary by orders of magnitude limiting the combinations of materials that can be used.

However, for polymeric materials, the elastic modulus can change by three orders of magnitude below and above the glass transition temperature (Aklonis and McKnight, 1983). It is just such a combination of a polymer above its glass transition temperature and one below its glass transition temperature (or in a crystalline form) that gives the greatest difference in coefficients of thermal expansion.

The prior art (e.g., U.S. Pat. No. 4,115,620 issued Sep. 19, 1978) discloses an even polymer blend (i.e., extruded at 50:50 ratio) and doesn't adjust the ratio of the two components to optimize bending.

Other prior art (e.g., U.S. Pat. No. 8,389,100 B2 issued Mar. 5, 2013 ("Rock et al.")) utilizes two different types of components (i.e., a polyethylene and a polypropylene). However it appears that Rock et al. utilizes about 50:50 ratio of these components in a side-by-side relationship.

Although U.S. Pat. No. 4,315,881 (issued Feb. 16, 1982) discloses that the ratio by weight of extruded fiber components is 30:70 to 70:30 and 40:60 to 60:40 it does not appear that these ranges are used (or manipulated) to optimize bending of the extruded material.

Generally, the prior art does not use the moments of inertia of the components to determine the ratio of those components (in an extruded material) and manipulate the shape of the extruded material to maximize bending. In addition, it does not appear that the prior art adjusts the ratio (of the moments of inertia to the Young's Modulus), of the components, so that they are substantially equal to one another to optimize bending nor does it appear that the prior art uses/manipulates the ratios to optimize bending of extruded material(s).

Thus there is a need to use a wider selection of materials of significantly different mechanical moduli. There is also a need to tailor the moments of inertia of at least two components, in an actuator, to enhance or suppress bending.

SUMMARY

Embodiments herein generally relate to actuators and more specifically to tailoring the moments of inertia of at least two components, of the actuator, to enhance or suppress bending.

Some embodiments herein generally relate to techniques optimizing the thermal response by knowing the characteristics of the materials used to make an actuator. For example, by knowing the characteristics (e.g., the ratio of the moment of inertia to the Young's Modulus ("Ratio1") of one component a second component having known characteristics (e.g., the ratio of the moment of inertia and the Young's Modulus ("Ratio2")) can also be selected. The amount of material used for the second component can be tailored so that that Ratio1 is substantially equal to Ratio2. In various embodiments, either/both of the components can have at least one cavity therein. The amount of the material used in either component, the materials selected, the shape of the actuator, whether to have at least one cavity in either/both components, and the size of the cavity/cavities (if any) are designed based upon making Ratio1 and Ratio2 substantially equal to one another.

Other embodiments herein generally relate to actuators with at least two components, where at least one of the components has at least one cavity within and to tailoring the moments of inertia of the components of the actuator to enhance or suppress bending.

For example, in one embodiment, a method is provided that acquires a first ratio of a modulus of inertia for a first component that contains at least one cavity to a Young's Modulus for the first component. The method also acquires a second ratio of a modulus of inertia for a second component to a Young's Modulus for the second component. Thereafter, the method provides an actuator (which includes at least one of the components having at least one cavity therein). The actuator has a cross-sectional shape such that the first ratio substantially equal to said second ratio.

In another embodiment, a method is provided that designs and determines a Ratio1 for a first component. Ratio1 is a modulus of inertia for the first component divided by a Young's Modulus for the first component. Thereafter, a second component is designed that has a Ratio2 substantially equal to the Ratio1 of the first component. Ratio2 is a modulus of inertia for the second component divided by a Young's Modulus for the second component. Thereafter, the first component and the second component can be used to make an actuator that is spun into fiber to make products (e.g., batting material, woven material, a suture, a thermostat needle, a gel, etc.).

In yet another embodiment, a computer-readable medium is provided that is used to design and determine a Ratio1 for a first component. Ratio1 is a modulus of inertia for the first component divided by a Young's Modulus for the first component. Thereafter, a second component is designed that has a Ratio2 substantially equal to the Ratio1 of said first component. Ratio2 is a modulus of inertia for the second component divided by a Young's Modulus for the second component. Thereafter, the first component and the second component can be used to make an actuator that is spun into fiber to make products (e.g., batting material, woven material, a suture, a thermostat needle, a gel, etc.).

Other embodiments of the invention are provided that include other methods, apparatuses, and computer-readable mediums having features similar to the method described herein.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures.

DETAILED DESCRIPTION

Figure 1:
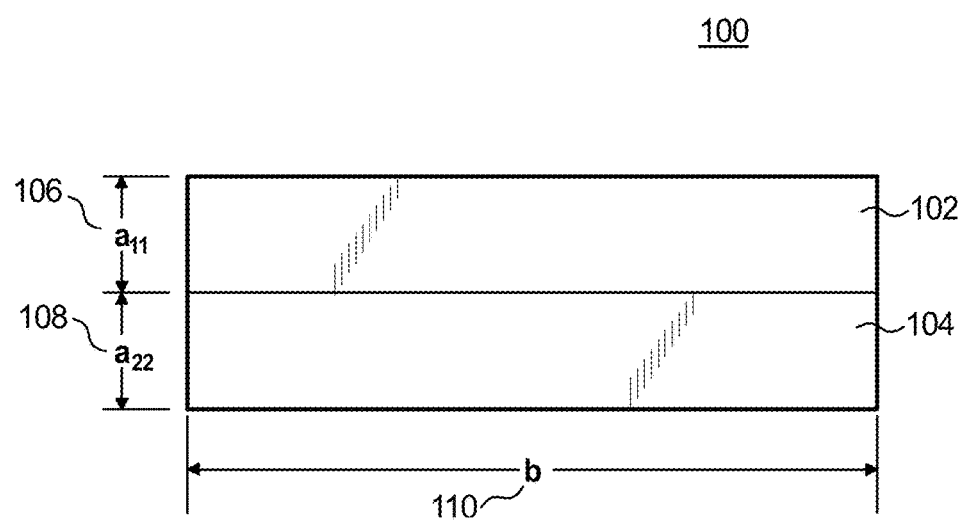
FIG. 1 depicts a bi-metal spring in accordance with the prior art.

In the following description, numerous specific details are set forth to provide a more thorough understanding of the invention. As will be apparent to those skilled in the art, however, various changes using different configurations may be made without departing from the scope of the invention. In other instances, well-known features have not been described in order to avoid obscuring the invention. Thus, the invention is not considered limited to the particular illustrative embodiments shown in the specification and all such alternate embodiments are intended to be included in the scope of the appended claims.

In short, embodiments of the invention make the ratio of the moment of inertia to the Young's Moduli for a first component equal to the ratio of the moment of inertia to the Young's Moduli for a second component. One way to make the two ratios equal is to provide a shape (i.e., the ratio) for the combination of the two components such that there is less of one component than the other component. Exemplary shapes are provided in FIGS. 2 and 3. It is to be understood that the shaped provided herein are for illustrative purposes only and not intended to limit the scope of the invention (i.e., limit the invention to the exemplary shapes).

Some of the commercial applications of embodiments of the invention include, but are not limited to, temperature adaptive insulation, stimuli responsive textiles, self-tightening sutures and switches/thermostats.

For illustrative purposes only, aspects of the invention are described herein as maximizing the bending of the actuators. However, these descriptions are not intended to limit the invention in any way. For example, aspects of the invention also include limiting the bending of the actuators.

For illustrative purposes only, aspects of the invention are described herein using polymers. However, these descriptions are not intended in any way to limit the scope of the invention nor are they intended to limit the scope of the materials which can be used.

One application of the invention is an adaptive thermal insulation for clothing and equipment that provides greater insulation at low temperatures and less at high temperatures. Clothing that adapts to changes in environmental conditions means that fewer items will be required to effectively protect soldiers over a wide range of operating temperatures.

For illustrative purposes only, embodiments of the invention are described herein with respect to temperature adaptive insulation. For example, soldiers must adapt their clothing to a wide variety of weather and climate conditions. This often means adding or subtracting garments and providing more or less ventilation by using openings in the clothing. The insulation required for thermal balance can change rapidly especially in mountainous regions as soldiers move from one altitude to another or encounter climatic variables. If the insulation level is too low it may result in hypothermia or frostbite leading to degraded performance (loss of dexterity and fine motor control). If the insulation level is too high it can result in unnecessary sweating which collects within the insulation, degrading the insulation and increases water consumption, which in turn may lead to dehydration.

Although the term "extrusion" is used herein that use is for illustrative purposes only and not intended, in any way, to limit the scope of the invention. For example, in various embodiments, compounds are bonded, secured, attached, or coupled to each other.

Figure 2:
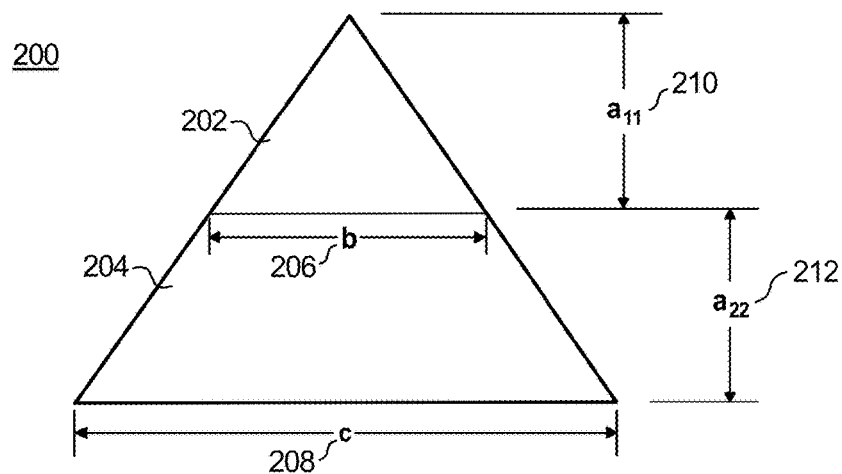
FIG. 2 depicts an embodiment of a cross-sectional shape in accordance with the material disclosed herein.

In aspects of the invention, moments of inertia of the components are tailored such that the response of materials with very different mechanical moduli is accommodated. As an example, one implementation of this is a bi-component fiber of triangular cross section (depicted in FIG. 2). In FIG. 2, a first component 202 is depicted as the "top" of the triangular shaped extrusion 200 while the second component 204 is the "bottom" of the triangular shaped extrusion 200 (note that the second component 204 has a trapezoidal shape).

Experimentally it is found that considerably greater bending can be seen in configurations with the first component 202 composed of a higher modulus material than the second compound 204 (rather than a reverse configuration with the second compound 204 on top).

FIG. 2 also depicts a length ("b") of one dimension 206 of first component 202 and a length ("c") of one dimension 208 of second component 204. First component 202 and second component 204 include heights $a_{11}$ and $a_{22}$, respectively. The curvature for triangular cross section 200 is provided in Equation (5), as follows:

$$\frac{1}{\rho_{tri}} = \frac{18(\alpha_2 - \alpha_1)(t - t_0)(1 + m)^2}{h\left\{9(1+m)^2 + 2(1+m)\left[(m^2+1)(1-a_1) + \frac{2(a_1 - a_1^2)}{(a_1+1)^2} + nm^3\frac{(a_1 - a_1^2)}{(a_1+1)} + \frac{1}{n}\frac{(a_1^2 + 4a_1 + 1)(1 - a_1)}{m(a_1^2 + a_1)}\right]\right\}} \quad \text{Eq. (5)}$$

where $$\frac{1}{\rho_{tri}}$$

is the radius of curvature of the triangular cross-section 200, h is the total height or diameter of the components 202 and 204, $\alpha_2$ is the coefficient of thermal expansion for component 204, $\alpha_1$ is the coefficient of thermal expansion for component 202, n is the ratio of the Young's moduli of the components 202 and 204, and m is a ratio of the thickness of components 202 and 204, $a_1$ is the height of the component 202, and $a_2$ is the height of component 204. Note that $a_1 + a_2 = 1$ and that $a_2 = 1 - a_1$ has been substituted into Equation (5).

Calculation of the moment of inertia for first component 202 is provided by Equation (6).

$$I_1 = \frac{a_{11}^3 b}{36} \quad \text{Equation (6)}$$

where $I_1$ is the moment of inertia for first component 202, $a_{11}$ is the height of the first component 202, and b is the length of one of the dimensions (i.e., the base) of the first component 202.

Calculation of the moment of inertia for the second component 204 is provided by Equation (7).

$$I_2 = \frac{a_{22}^3(b^2 + 4bc = c^2)}{36(b+c)} \quad \text{Equation (7)}$$

where $I_2$ is the moment of inertia for second component 204, $a_{22}$ is the height of the second component 204, and b and c are lengths of the upper and lower sides (of the trapezoid) of the second component 204.

Equation (5) is simplified to Equation (8) when m=1.

$$\frac{1}{\rho_{tri}} = \frac{72(\alpha_2 - \alpha_1)(t - t_0)}{h\left[41 + \frac{2}{3}n + \frac{26}{3}\frac{1}{n}\right]} \quad \text{Equation (8)}$$

where $$\frac{1}{\rho_{tri}}$$

is the radius of curvature of the triangular shaped extrusion 200, h is the total height of the triangular shaped extrusion 200, $\alpha_2$ is the coefficient of thermal expansion for component 204, $\alpha_1$ is the coefficient of thermal expansion for component 202, n is the ratio of the Young's moduli of the components 202 and 204.

Figure 3:
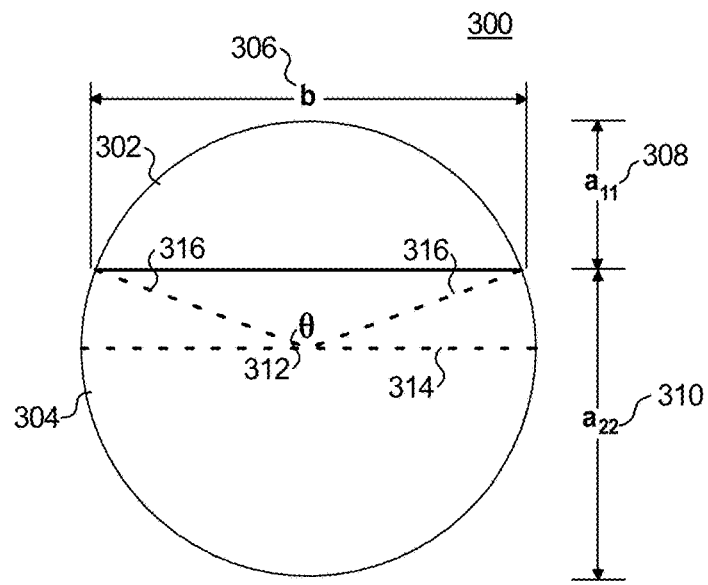
FIG. 3 depicts an embodiment of a cross-sectional shape in accordance with the material disclosed herein.

FIG. 3 depicts another embodiment 300 of the invention. Specifically, FIG. 3 depicts a substantially circular shaped cross-section 300. The substantially circular shaped cross-section 300 includes a first component 302 (at an upper portion of the cross-section 300) and a second component 304 (at a lower portion of the cross-section 300).

The first component 302 includes a height 308 ($a_{11}$) and a dimensional length 306 (b). The second component 304 includes a height 310 ($a_{22}$). Extrusion 300 includes a diameter 314 (depicted in dashed lined). Angle θ 312 is taken from the diameter 314 (and center of cross-section 300) and is the angle formed between the diameter 314 and dashed lines 316 extending from the center of the extrusion 300 to the ends of dimensional length 306.

The curvature for circular shaped cross-section 300 is provided below in Equation (9), (10), (11), and (12) (when components 302 and 304 are of unequal height).

$$X = \frac{(\theta - \sin\theta)}{2} \quad \text{Equation (9)}$$

where X is used as a substitution to simplify Equation (12).

$$F = \pi - \frac{(\theta - \sin\theta)}{2} \quad \text{Equation (10)}$$

where F is used as a substitution to simplify Equation (12).

$$k = \frac{A_1}{A_2} \quad \text{Equation (11)}$$

where $A_1$ represents the cross-sectional area of the first component 302 and $A_2$ represents the cross-sectional area of the second component 304.

When $a_{11} \leq \frac{h}{2}$, $$\frac{1}{\rho_{circ}} = \frac{2EF(\alpha_2 - \alpha_1)(t - t_0)}{h\{EF + [n(BE - C) + \frac{\pi}{4}E - k(BF + C)]\left(\frac{1}{nk+1}\right)\}} \quad \text{Equation (12a)}$$

(i.e., when $\theta = \pi$ and $k = 1$)

where $$\frac{1}{\rho_{circ}}$$

is the radius of curvature of the circular cross-section 300, h is the total height or diameter of the circular cross-section 300, $\alpha_2$ is the coefficient of thermal expansion for component 304, $\alpha_1$ is the coefficient of thermal expansion for component 302, n is the ratio of the Young's moduli of the components 302 and 304, m is a ratio of the thickness of components 302 and 304, X is provided by Equation (9), F is provided by Equation (10), k is the ratio of cross-sectional areas of the first component 302 to the second component 304, and B and C are functions of the geometry of the circle and are used as a substitute for variables to simply Equation (12a).

When $a_{11} > \frac{h}{2}$, $$\frac{1}{\rho_{circ}} = \frac{2EF(\alpha_2 - \alpha_1)(t - t_0)}{h\{EF + [nk(BE - C) + \frac{\pi}{4}F - (BF + C)]\left(\frac{1}{nk+1}\right)\}} \quad \text{Equation (12b)}$$

where $$\frac{1}{\rho_{circ}}$$

is the radius of curvature of the circular cross-section 300, h is the total height or diameter of the circular cross-section 300, $\alpha_2$ is the coefficient of thermal expansion for component 304, $\alpha_1$ is the coefficient of thermal expansion for component 302, n is the ratio of the Young's moduli of the components 302 and 304, m is a ratio of the thickness of components 302 and 304, X is provided by Equation (9), F is provided by Equation (10), k is the ratio of cross-sectional areas of the first component 302 to the second component 304, and B and C are functions of the geometry of the circle and are used as a substitute for variables to simply Equation (12b).

Equation (12a) can be simplified to Equation (13) when the areas of the two components are equal (i.e., when $\theta = \pi$ and k=1).

$$\frac{1}{\rho_{circ}} = \frac{\frac{\pi^2}{2}(\alpha_2 - \alpha_1)(t - t_0)}{h\left[\left(\frac{3\pi^2}{8} - \frac{8}{9}\right) + \left(\frac{\pi^2}{16} - \frac{4}{9}\right)n + \left(\frac{\pi^2}{16} - \frac{4}{9}\right)\frac{1}{n}\right]} \quad \text{Equation (13)}$$

where $$\frac{1}{\rho_{circ}}$$

is the radius of curvature of the circular cross-section 300, h is the total height or diameter of the circular cross-section 300, $\alpha_2$ is the coefficient of thermal expansion for component 304, $\alpha_1$ is the coefficient of thermal expansion for component 302, n is the ratio of the Young's moduli of the components 302 and 304, and m is a ratio of the thickness of components 302 and 304.

Embodiments of the invention use the ratio of the moment of inertia to the Young's Moduli for a first component equal to the ratio of the moment of inertia to the Young's Moduli for a second component to create shaped fibers that bend in response to temperature. The shaped fibers are multi-component fibers (e.g., bi-component or tri-component fibers). Multi-component spinning can be used as a cost effective way of producing large quantities of fibers that bend as the temperature changes.

One way to use such fibers is to create a loose mat or batting. Battings are commonly used as insulation in, for example, jackets and sleeping bags. In various embodiments, the polymeric fibers (e.g., bi-component or tri-component polymeric fibers having circular or triangular cross-sections) are used to provide insulation which changes thickness in response to temperature. The polymeric fibers have at least two components with different coefficients of thermal expansion (CTE). As the temperature changes polymeric fibers are temperature responsive and curl as the temperature is decreased. Curling of the polymeric fibers (in response to the decrease temperature) causes the insulation thickness to increase providing greater thermal insulation.

As indicated above, bi-component and tri-component fibers can spun from commercially available polymers of widely differing coefficients of thermal expansion. Some combination of polymers and fiber geometry results in changes of more than two orders of magnitude ($>1.5 \times 10^{-2}$ per ° C.).

Fibers can be spun to create a temperature adaptive thermal insulation using a tri-component fiber extruder. One of the purposes of a third component (depicted in FIG. 7) is to limit the interfacial shear between the high and low CTE components.

In some embodiments of the invention, thickness changes by more than 1.5% per ° C. (30% over a temperature range from approximately 20° C. to 0° C.).

Figure 4:
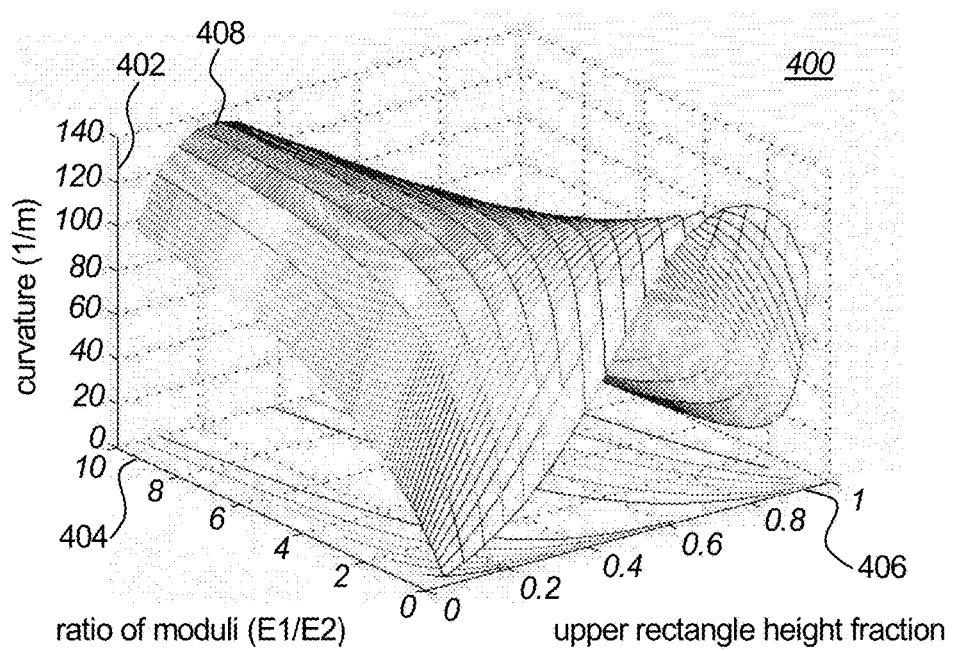
FIG. 4 depicts a graph of the temperature response (i.e., curvature) using a polymer having a rectangular shaped cross-section.

FIG. 4 depicts a plot 400 of the temperature response (i.e., curvature) using Equation (1). Specifically, graph 400 includes a curvature 402 (parallel to a "Z axis"), a ratio of moduli $$\left(\frac{E_1}{E_2}\right)$$

404 (parallel to a "Y axis"), and an upper rectangle height fraction 406 (parallel to an "X axis"). The graph 400 depicts plot 408 which shows that when the ratio of the moduli are equal to 1 then the optimum bending occurs at 50% of each component. The maximum bending at any ratio of the moduli 404 from 0-10 is different depending upon the composition of the fiber.

Figure 5:
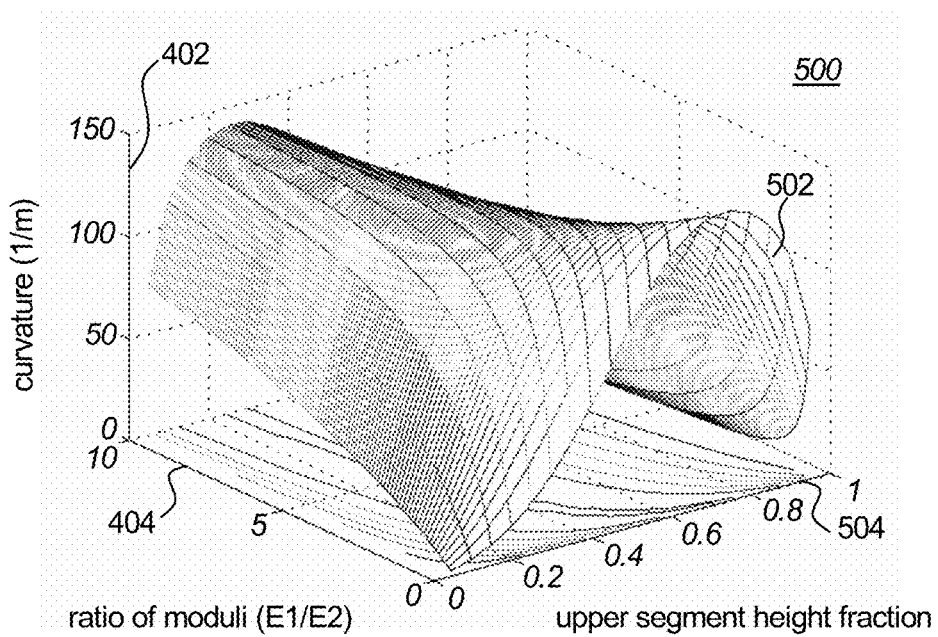
FIG. 5 depicts a graph of the temperature response for a polymer having a circular cross-section in accordance with embodiments disclosed herein.

FIG. 5 shows a graph 500 of the temperature response for a series when the area fraction of the base of the triangle is systematically varied. Specifically, graph 500 includes a curvature 402 (parallel to a "Z axis"), a ratio of moduli $$\left(\frac{E_1}{E_2}\right)$$

404 (parallel to a "Y axis"), and an upper segment height fraction 504 (parallel to an "X axis"). The graph 500 depicts plot 502 which shows that when compared to a rectangular cross-section (e.g., in the plot 408) that a circular cross-section provides a potential for greater bending of the fiber (in various embodiments) and greater suppression of bending of the fiber (in other embodiments). In addition, plot 502 also shows that the components used can be at a higher ratio of the moduli than taught in the prior art.

Figure 6:
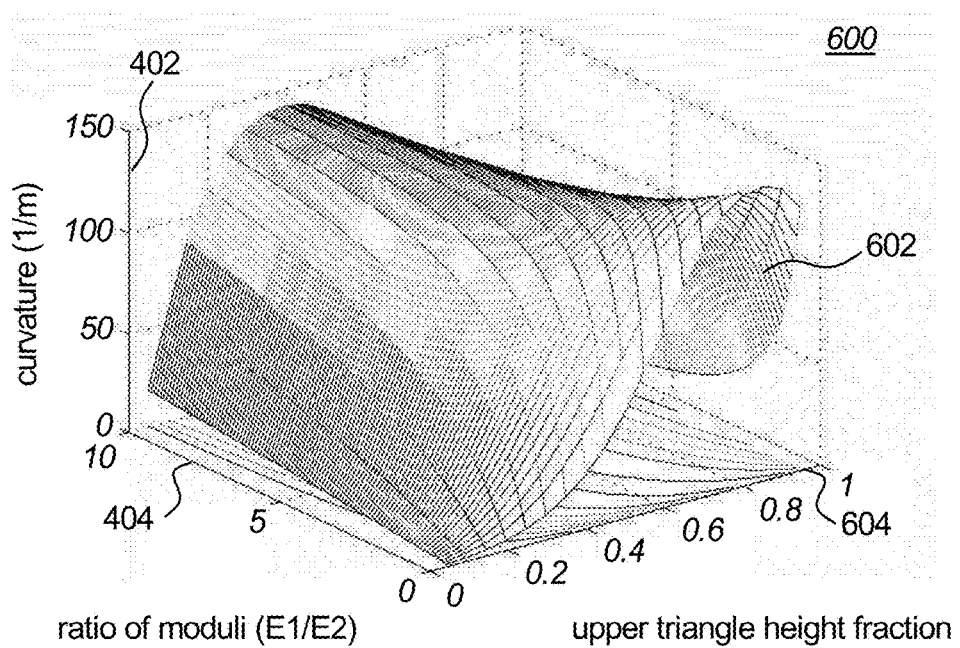
FIG. 6 depicts a graph of the temperature response for a systematically varied area fraction of the base of the triangle in accordance with embodiments disclosed herein.

FIG. 6 depicts a graph 600 of the temperature response for a systematically varied area fraction of the base of the triangle in accordance with embodiments of the invention. Specifically, graph 600 includes a curvature 402 (parallel to a "Z axis"), a ratio of moduli $$\left(\frac{E_1}{E_2}\right)$$

404 (parallel to a "Y axis"), and an upper triangle height fraction 604 (parallel to an "X axis"). The graph 600 depicts plot 602 which shows that when compared to a rectangular cross-section (e.g., in the plot 408) that a triangular shaped cross-section provides a potential for greater bending of the fiber (in various embodiments) and greater suppression of bending of the fiber (in other embodiments). In addition, plot 602 also shows that the components used can be at a higher ratio of the moduli than taught in the prior art.

It appears from plot 604 that the batting is stronger for decreasing area fraction of the bottom section (i.e., second component 204) of a triangular shaped cross-section of a fiber. The results are consistent with the analytical model. Some Fiber samples show a change in the thickness of 1.8% per ° C. while the lowest response is about 0.3% or less. In some embodiments, an area fraction of 0.3 is the approximate lower limit for the fiber spinning apparatus. Plot 604 indicates an optimum response at a level that is a function of the ratio of the mechanical moduli of the components in a two component system.

In various embodiments of the invention, isotactic and syndiotactic polypropylene (i-PP, s-PP) are the components used in the fibers. The isotactic polymer is of a relatively high crystallinity and has a relatively high modulus and low coefficient of thermal expansion. In contrast, the syndiotactic polymer crystallizes slowly and is expected to have a high CTE and a low modulus.

Values for polypropylene can be taken from Uehara, H., Yamazaki, Y. and Kanamoto, T. Tensile Properties of Highly Syndiotactic Polypropylene. 1996, Vol. 37, 1, pp. 57-64 (hereinafter "Uehara") for calculation and comparison of values obtained during testing. For example, drawn isotactic polypropylene presumed to have a fiber modulus of 20 GPa while well drawn syndiotactic polypropylene had a fiber modulus of 3 GPa and a ratio of 6.67-to-1. A typical CIL for an amorphous polymer is around $10^{-4}$ m/m ° C. Crystalline and highly oriented polymeric fibers can have a negative CTE along the length of the fiber. The chain axis CTE for isotactic PP crystals is negative, $-1 \times 10^{-5}$ m/m ° C.

In various embodiments of the invention, fibers are spun from commercial grades of polypropylene. In various embodiments, spun fibers have an edge length of approximately about 50 microns. In various embodiments, fibers are spun with a draw ratio of about 2.5-to-1 and collected onto rolls of about 15 cm diameter. Crystalline and highly oriented polymeric fibers can have a negative CTE along the length of the fiber. The chain axis CTE for isotactic PP crystals is negative, $-1 \times 10^{-5}$ m/m ° C.

In various embodiments, the CTE and modulus in the fiber direction of each component is a function of the level of crystallinity and the orientation of the crystal, amorphous and intermediate phases.

Figure 7:
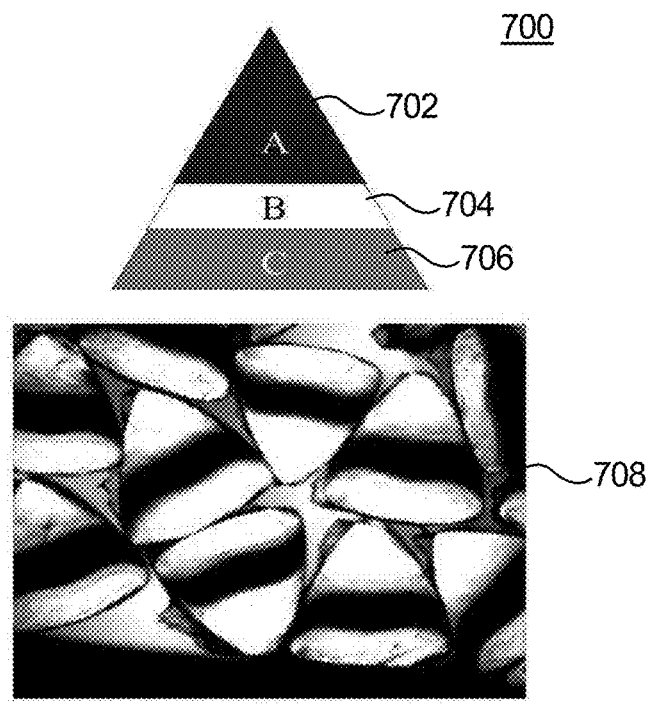
FIG. 7 depicts a triangular cross-section of a fiber in accordance with embodiments disclosed herein.

FIG. 7 depicts a triangular cross-section of a fiber 700 in accordance with embodiments of the invention. The fiber 700 includes a first component 702, a center section 704, and a second component 706.

In various embodiments, the first component 702 is s-PP, the second component 706 is i-PP, and the center section 704 includes a small amount of dye added to a random ethylene propylene copolymer (co-EP) with a low modulus to limit interfacial stress between the first component 702 and the second component 706 but with a coefficient of thermal expansion similar to s-PP.

In various embodiments, a high modulus polymer of the second component 706 provides a modulus ratio of 1/6.67 or 0.15. From the equations above (e.g., Equations (5), (6), (7), and (8)), for a system with this modulus ratio, the maximum curvature is predicted to occur when the fraction of the first component 702 is between about 0.8 and about 0.85 (second component fraction between about 0.2 and about 0.15). A micrograph 708 of actual fibers is also depicted in FIG. 7. "Table 1" below provides examples of fibers (e.g., Fiber 1) and component ratios.

TABLE 1

| | polymer/area fraction of each polymer | | |
|---|---|---|---|
| Fiber | A (s-PP) | B (co-EP) | C (i-PP) |
| 1 | 0.5 | 0.2 | 0.3 |
| 2 | 0.45 | 0.2 | 0.35 |
| 3 | 0.40 | 0.20 | 0.40 |
| 4 | 0.35 | 0.20 | 0.45 |
| 5 | 0.30 | 0.20 | 0.50 |

Fibers cut from rolls are spontaneously curled to form batting. The curling is the result of relaxation of stresses from the spinning process and the change in length as the fibers are cooled from the spinning temperature.

The battings can then die cut into samples for testing (e.g., cut into about 20 in² (129 cm²) circular samples). The thickness of the samples can be measured in a temperature controlled chamber by compressing the samples with a pressure of about 0.02 psi. The thickness of the samples can first measured be at room temperature then in an environmental chamber cooled to zero ° C.

Figure 8:
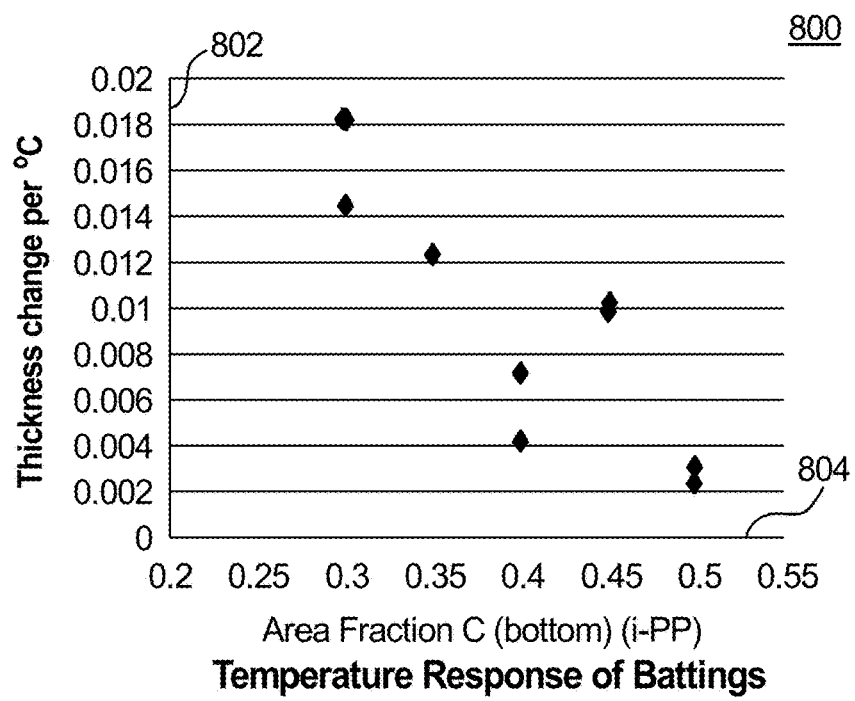
FIG. 8 depicts a plot of a temperature response for an exemplary cross-section of an actuator in accordance with material disclosed herein.

FIG. 8 depicts a plot 800 of a temperature response for an exemplary cross-section of an actuator in accordance with embodiments of the invention. Specifically, FIG. 8 shows the change in thickness of batting per ° C. 802 (parallel to the "Y-axis") where the area fraction of the base of the triangle 804 (parallel to the "X-axis") is systematically varied. The results are consistent with the analytical model. For example, FIG. 8 depicts a change in thickness of 1.8% per degree C. while the lowest response is about 0.3% or less. An area fraction of about 0.3 is the approximate lower limit for the fiber spinning apparatus.

An analysis of the thermally-induced curvature of bi-component fibers of various cross-sections with respect to the ratio of the moduli of the components and the fraction of the cross-section that each component occupies is provided. Graphical analysis of these functions supports qualitatively that to achieve maximum curvature of the fibers, the design space of interest resides along the "spine" of the surfaces. Quantitatively, the functions allow the proportions of the components to be selected to maximize the fiber curvature for a given pair of polymers. Experimental fibers of varying component fractions were spun, formed into mats and their thickness measured at various temperatures. The experimentally measured thickness changes are in good agreement with the analytical results for fiber bending. Based on a one dimensional heat transfer model the change in thickness appears to be sufficient for a practical adaptive thermal insulation.

Figure 9:
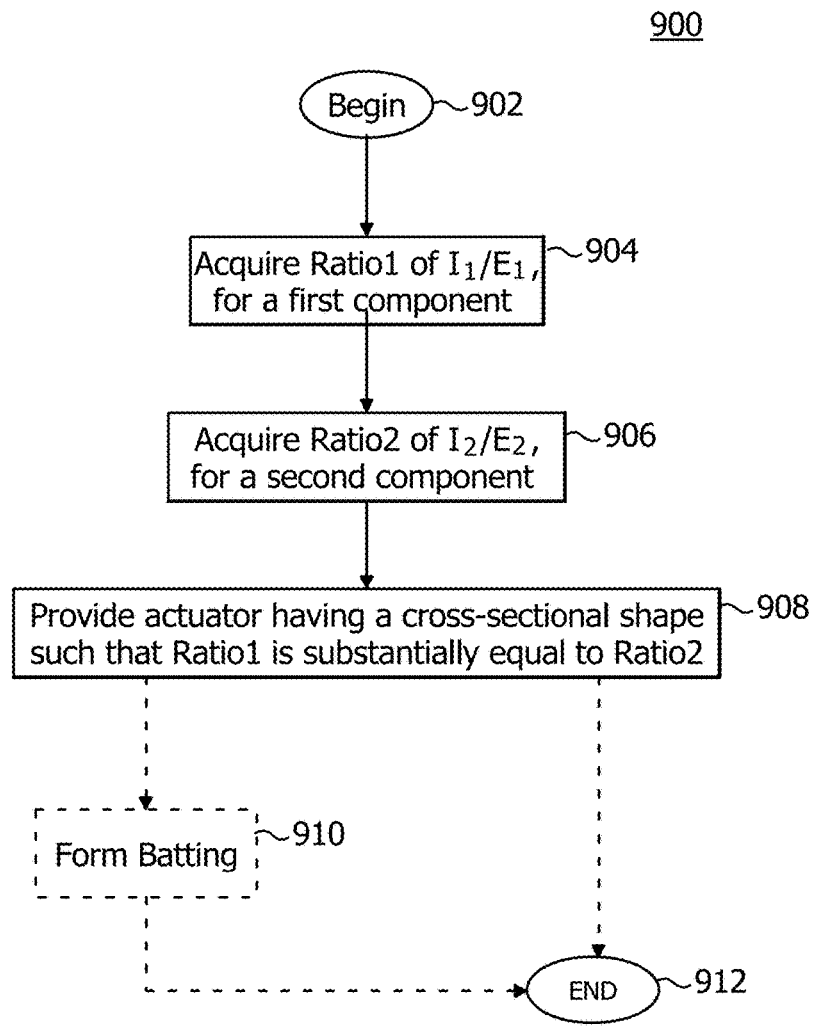
FIG. 9 depicts an embodiment of a method in accordance with material disclosed herein.

FIG. 9 depicts an embodiment of a method 900 in accordance with embodiments of the invention. The method 900 begins at step 902 and proceeds to step 904.

At step 904, a ratio (i.e., "Ratio1") is determined between the moment of inertia and the Young's modulus for a first component. Thereafter, the method 900 proceeds to step 906.

At step 906, a ratio (i.e., "Ratio2") is determined between the moment of inertia and the Young's modulus for a second component. Thereafter, the method 900 proceeds to step 908.

At step 908, an actuator is formed (e.g., spun fibers or adhesion) using the first component and the second component. Ratio1 and Ratio2 determine the amounts of the first component and the second component used. The amount of each component is adjusted until the ratios I/E (of each component) are substantially the same. So that Ratio1 and Ratio2 are substantially equal the actuators can have non-rectangular shapes (e.g., triangular or circular). After formation of the actuators, the method 900 proceeds to and ends at step 912.

In various embodiments, the method 900 proceeds to optional step 910. At optional step 910 the actuators (when the actuators are spun fibers) are formed into batting. After optional step 910, the method proceeds to and ends at step 912.

Figure 10:
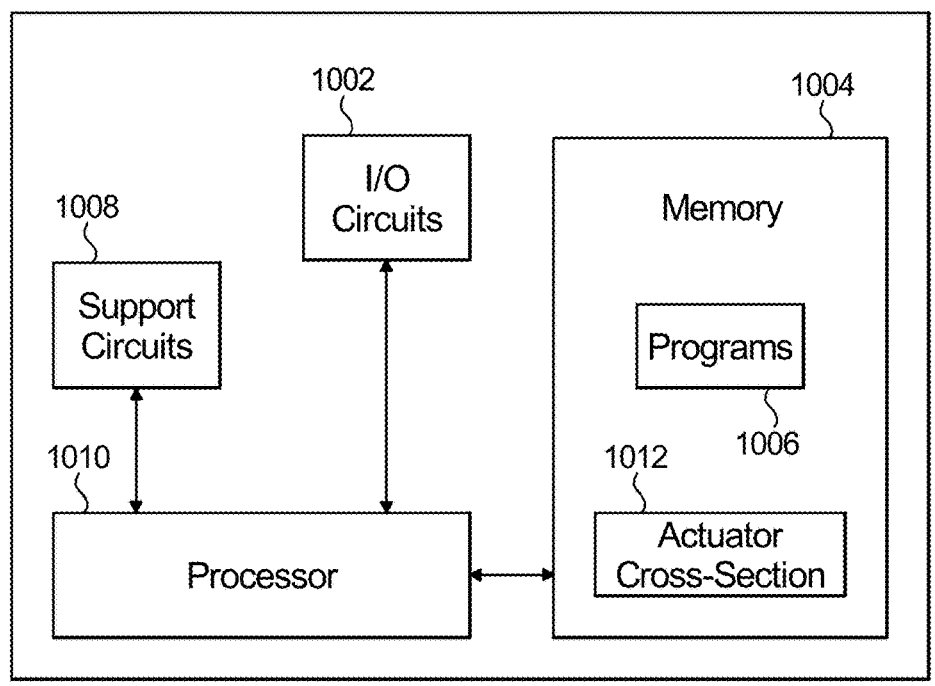
FIG. 10 depicts an embodiment of a high-level block diagram of a general-purpose computer architecture 1000 for providing an actuator in accordance with material disclosed herein.

FIG. 10 depicts an embodiment of a high-level block diagram of a general-purpose computer architecture 1000 for an actuator in accordance with embodiments of the invention. For example, the general-purpose computer 1000 is suitable for use in performing the methods of FIGS. 9, 15, 16, and 17. The general-purpose computer of FIG. 10 includes a processor 1010 as well as a memory 1004 for storing control programs and the like.

In various embodiments, memory 1004 also includes programs (e.g., depicted as an "actuator cross-section" 1012 for creating actuators having a cross-sectional shape such that a ratio of the moment of inertia to Young's modulus for a first component is substantially equal to the moment of inertia to Young's modulus for a second component) for performing the embodiments described herein.

In other embodiments, the memory 1004 includes programs (not shown) for designing a first component having a Ratio1 for that first component. Ratio1 is a modulus of inertia for the first component divided by a Young's Modulus for the first component. The program is also used to design a second component that has a Ratio2 substantially equal to the Ratio1 of the first component. Ratio2 is a modulus of inertia for the second component divided by a Young's Modulus for the second component. When instructed these programs can place at least one cavity in the first component and/or the second component while still making Ratio1 substantially equal to Ratio2. Thereafter, the first component and the second component can be used to make an actuator that is spun into fiber to make products (e.g., batting material, woven material, a suture, a thermostat needle, a gel, etc.).

The processor 1010 cooperates with conventional support circuitry 1008 such as power supplies, clock circuits, cache memory and the like as well as circuits that assist in executing the software routines 1006 stored in the memory 1004. As such, it is contemplated that some of the process steps discussed herein as software processes can be loaded from a storage device (e.g., an optical drive, floppy drive, disk drive, etc.) and implemented within the memory 1004 and operated by the processor 1010. Thus, various steps and methods of the present invention can be stored on a computer readable medium. The general-purpose computer 1000 also contains input-output circuitry 1002 that forms an interface between the various functional elements communicating with the general-purpose computer 1000.

Although FIG. 10 depicts a general-purpose computer 1000 that is programmed to perform various control functions in accordance with the present invention, the term computer is not limited to just those integrated circuits referred to in the art as computers, but broadly refers to computers, processors, microcontrollers, microcomputers, programmable logic controllers, application specific integrated circuits, and other programmable circuits, and these terms are used interchangeably herein. In addition, although one general-purpose computer 1000 is depicted, that depiction is for brevity on. It is appreciated that each of the methods described herein can be utilized in separate computers.

Figure 11:
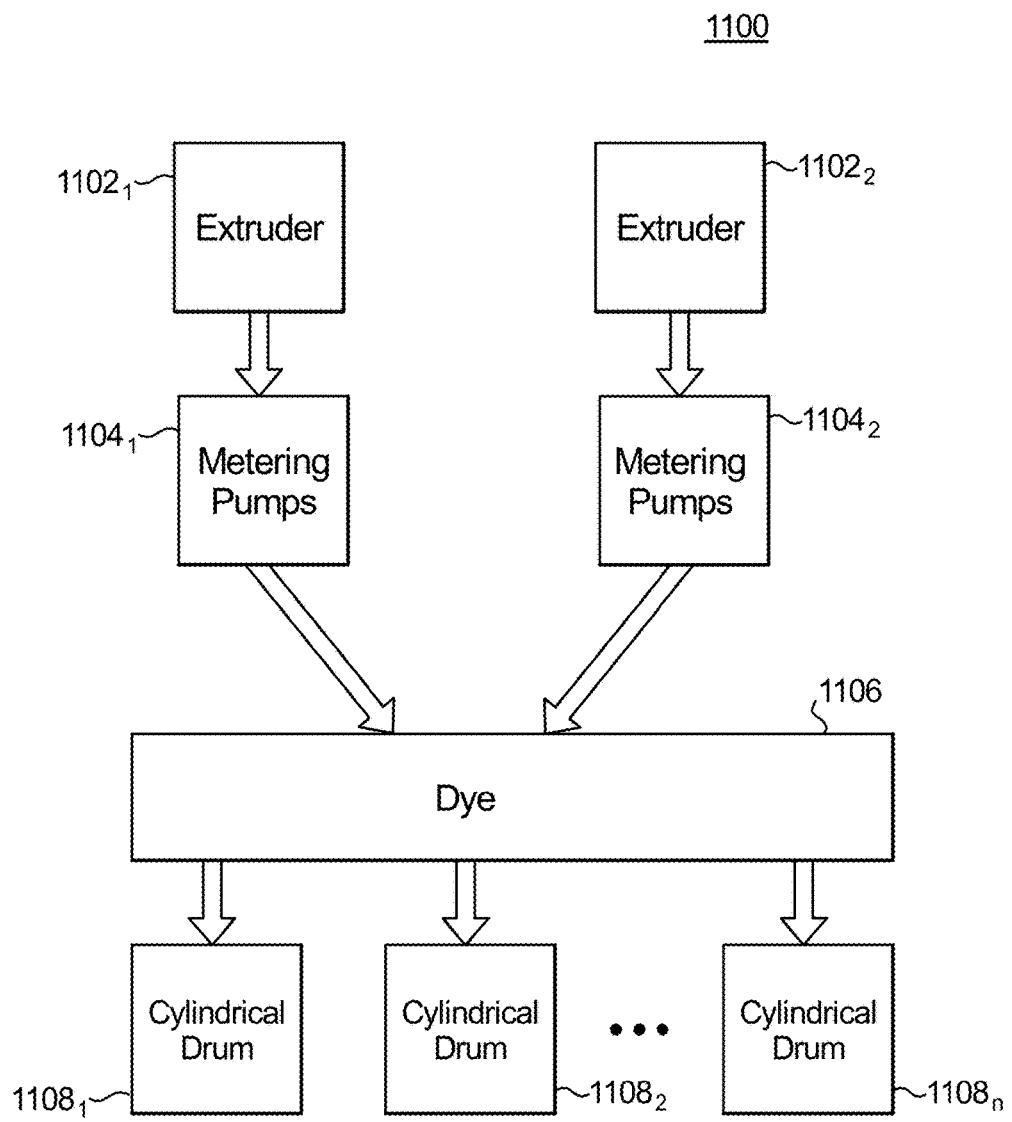
FIG. 11 depicts an embodiment of a system in accordance with material disclosed herein.

FIG. 11 depicts an embodiment of a system 1100 in accordance with material disclosed herein.

The system 1100 includes an extruder $1102_1$ and extruder $1102_2$. Each of the extruders $1102_1$ and $1102_2$ are adapted to receive a different component (e.g., one polymer is poured into extruder $1102_1$ and a different polymer is poured into extruder $1102_2$). Illustratively, the polymer poured into extruder $1102_1$ is one of isotactic polypropylene, a polyethyleneterephthalate (PET) and polyester; and the polymer poured in extruder $1102_2$ is one of an amorphous polymer, a syndiotactic polypropylene, and a polycarbonate. After polymers are poured into the extruders $1102_1$ and $1102_2$, the extruders $1102_1$ and $1102_2$ melt the polymers.

After the polymers melt, the extruders $1102_1$ and $1102_2$ force the polymers through metering pumps $1104_1$ and $1104_2$. Each metering pumps $1104_1$ and $1104_2$ regulate the amount of melted polymer that passes through the metering pump $1104_1$ and $1104_2$ to a dye 1106. A ratio of a modulus of inertia to a Young's Modulus for each component (illustratively referred to hereinafter as the "first ratio" and "second ratio" respectively) is acquired. The metering pumps $1104_1$ and $1104_2$ regulate the amount of each polymer that passes through the dye 1106. The dye 1106 has an internal periphery which shapes and combines the two polymers. The metering pumps $1104_1$ and $1104_2$ regulate the amount of polymer passing through each respective pump such that the amount extruded through the dye 1106 results in the first ratio being substantially equal to the second ratio. In addition, the internal periphery (of the dye 1106) forces an actuator (not shown) (i.e., a combination of the two polymers) passing through the dye 1106 to have the internal periphery of the dye 1106. The resulting actuator has a cross-sectional shape (e.g., a triangular cross-section or a substantially circular cross-section) where the first ratio is substantially equal to said second ratio.

After an actuator is formed (i.e., as fibers), the fibers are spun onto cylindrical drum $1108_1$. In various embodiments, the system 1100 includes multiple cylindrical drums $1108_1$, $1108_2$, . . . and $1108_n$.

Illustratively, FIG. 11 depicts a bi-component extruder. However, that depiction is not intended in any way to limit the scope of the invention. For example, embodiments of the invention can be used in conjunction with tri-component extruders.

In various embodiments of the invention can be utilized with Micro-Electro-Mechanical-Systems ("MEMS"). Embodiments of the invention can be used to design/build actuators by machining, Computer Numerical Controlled machining ("CNC"), and micromachining processes. Even at the micron or nanometer level aspects of the invention can be used to make an actuator.

Figure 12:
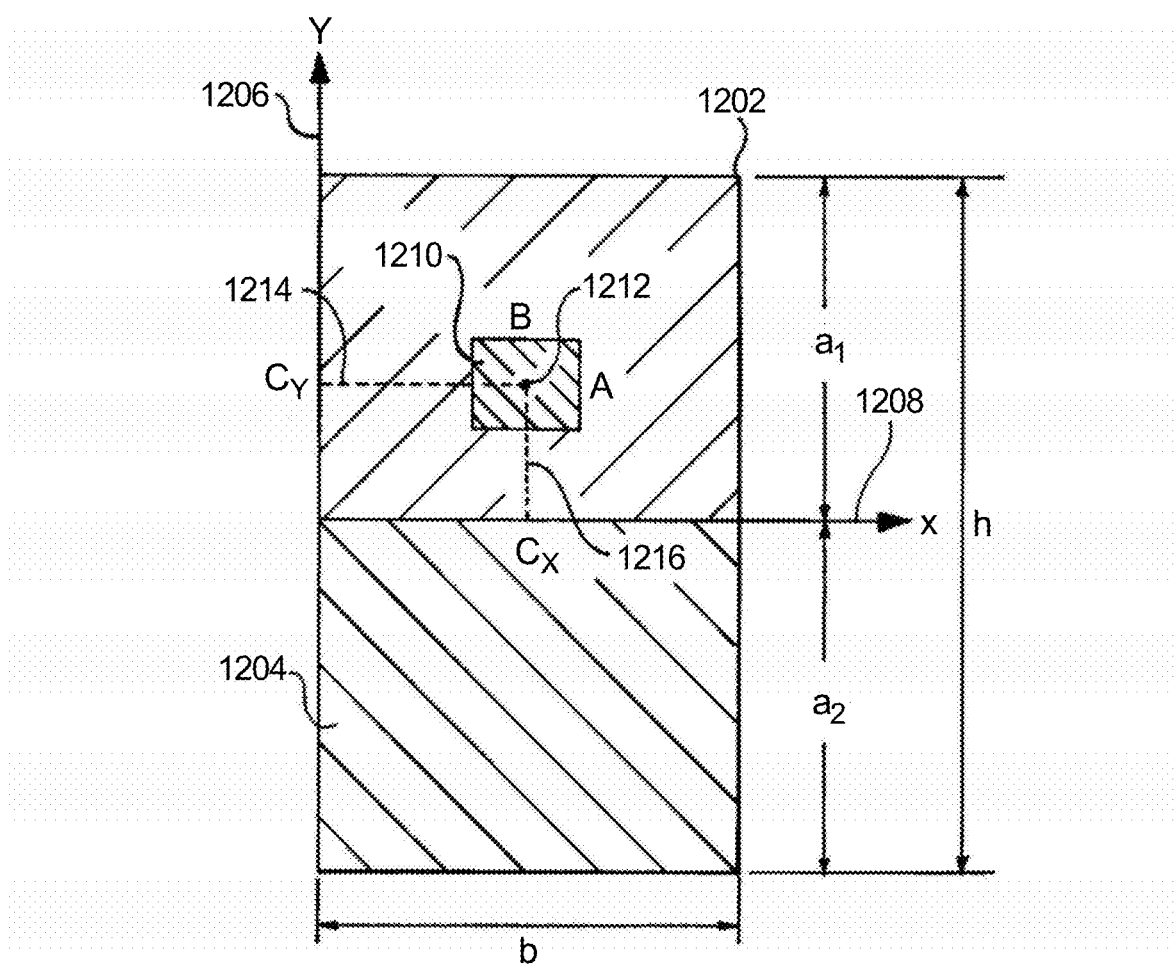
FIG. 12 depicts an exemplary embodiment of a substantially rectangular cross-section, of a component, in accordance with material disclosed herein.

FIG. 12 depicts an exemplary embodiment of a substantially triangular cross-section, of an actuator 1200, in accordance with material disclosed herein. The actuator 1200 includes a first component 1202 and a second component 1204. For illustrative purposes only, the first component 1202 is depicted, in FIG. 12, (and described below) as including one cavity 1210. However, it is appreciated that in various embodiments, the first component 1202 has more than one cavity (or no cavity) and/or the second component 1204 includes no cavity or at least one cavity.

Note that "cavity" and "void" are interchangeably used herein.

A "Y-axis" 1206 and an "X-axis" 1208 are placed against the first component 1202. Alphanumeric character "$a_2$" designates the maximum height of the first component 1202 along the "Y-axis" 1206. Alphanumeric character "$a_1$" designates the maximum height of the second component 1204 along the "Y-axis" 1206. Alphanumeric character "b" designates the maximum length of the first component 1202 and the second component 1204 along the "X-axis" 1206.

Inside the first component 1202 is a cavity 1210. The cavity 1210 has a centroid 1212. Alphanumeric character "$C_Y$" 1214 designates the coordinate of the centroid 1212 along the "Y-axis" 1206. Alphanumeric character "$C_X$" 1216 designates the coordinate of the centroid 1212 along the "X-axis" 1204.

The cavity 1210 is illustratively depicted as having a substantially rectangular shape. However, that depiction is not intended to limit the scope of the material taught herein in any way. It is appreciated that in various embodiments the cavity 1210 has another shape (e.g., a substantially circular shape, a substantially triangular shape, etc.).

When a component(s) includes a void, the centroid of the void moves as the void is moved up or down (i.e., vertically) within the component. An equation for the distance of the centroid from the X-axis is a variable of both, the size of the void and location within the component (i.e., the void centered along the X-axis).

Below, the moment of inertia is calculated for the first component 1202 without the cavity 1210. Thereafter, the moment of inertia is calculated for the area occupied by the cavity 1208.

For simplicity, calculations below regarding FIG. 12 are considered in three parts. For example, a first part relates to calculations on the first component 1202 without consideration of the cavity 1208. Variables relating to the first part include an "I" in the subscript of the variable.

A second part relates to calculations involving the first component 1202 minus the cavity 1208. Variables relating to the second part include an "II" in the subscript of the variable.

A third part relates to calculations involving the cavity 1208. Variables relating to the third part include an "III" in the subscript of the variable. The calculations below acquire the moment of inertia for the first part, the moments of inertia for the third part, and subtract the moments of inertia of the third part from the moments of inertia from the first part to obtain the moments of inertia of the second part (i.e., the moments of inertia of the component 1202 with cavity 1208).

For example let, $$A = f_a a \quad\quad\quad \text{Equation (14)}$$

where "A" is the length of the cavity 1210 along the "Y-axis" 1206, "$f_a$" is the ratio of the cavity height to the first component height, and "a" is the maximum height of the component 1202 along the "Y-axis" 1206.

$$B = f_b b \quad\quad\quad \text{Equation (15)}$$

where "B" is the length of the cavity 1210 along the "X-axis" 1208, "$f_b$" is the ratio of the cavity length to the component length, and "b" is the maximum length of the component 1202 along the "X-axis" 1208.

$$\left(\frac{A}{2} < C_y < a - \frac{A}{2}\right) \quad\quad\quad \text{Equation (16)}$$

where, $(0 < f_a, f_b < 1)$ and $\frac{f_a}{2} < f_c < \left(1 - \frac{f_a}{2}\right)$ where "$C_y$" is the distance from the "Y-axis" 1206 to the centroid 1212 of the cavity 1210, "A" is the length of the cavity 1210 along the "Y-axis" 1206, and "a" is the maximum height of the component 1202 along the "Y-axis" 1206.

As indicated above, the centroid 1212 location will move as the cavity 1210 is moved up or down within the section, so:

$$y_c = \frac{ab\left(\frac{a}{2}\right) - ABC_y}{ab - AB} = \frac{a(1 - 2f_a f_b f_c)}{2(1 - f_a f_b)} \quad\quad\quad \text{Equation (17)}$$

where "$y_c$" is the distance of the centroid 1210 from the "X-axis" 1208, "a" is the maximum height of the component 1202 along the "Y-axis" 1206, "b" is the maximum length of the component 1202 along the "X-axis" 1208, "A" is the length of the cavity 1210 along the "Y-axis" 1206, where "B" is the length of the cavity 1210 along the "X-axis" 1208, "$C_y$" is the distance from the "Y-axis" 1206 to the centroid 1212, "$f_a$" is the ratio of the cavity height to the first component height, "$f_b$" is the ratio of the cavity height to the component height, and "$f_c$" is the ratio of "$C_y$" to the first component height.

For example, when $f_c$=0.5 in Equation (17) then:

$$y_c = \frac{a}{2} \qquad \text{Equation (18)}$$

where "$y_c$" is the distance of the centroid 1210 from the "X-axis" 1208 and "a" is the maximum height of the component 1202 along the "Y-axis" 1206.

With this relation for $y_c$ the moment of inertia can be found:

$$A_I = ab \qquad \text{Equation (19)}$$

where "$A_I$" is the area of the upper component 1202, "a" is the maximum height of the component 1202 along the "Y-axis" 1206, and "b" is the maximum length of the component 1202 along the "X-axis" 1208.

$$A_{III} = AB \qquad \text{Equation (20)}$$

where "$A_{III}$" is area of the cavity 1210, "A" is the length of the cavity 1210 along the "Y-axis" 1206, and "B" is the length of the cavity 1210 along the "X-axis" 1208.

$$A_{II} = A_I - A_{III} = ab - AB = ab - f_a a f_b b = ab(1 - f_a f_b) \qquad \text{Equation (21)}$$

where "$A_{II}$" is the area of the first component 1202, "$A_I$" is the area of the first component 1202 and the cavity 1210, "$A_{III}$" is area of the cavity 1210, "a" is the maximum height of the component 1202 along the "Y-axis" 1206, "b" is the maximum length of the component 1202 along the "X-axis" 1208, "A" is the length of the cavity 1210 along the "Y-axis" 1206, "B" is the length of the cavity 1210 along the "X-axis" 1208, "$f_a$" is the ratio of the cavity height to the first component height, and "$f_b$" is the ratio of the cavity height to the component height.

$$I_{Ix} = I_{IIx} / I_{IIIx}, \qquad \text{Equation (22)}$$

where "$I_{Ix}$" is the moment of inertia of the first component 1202 and the cavity 1210, "$I_{IIx}$" is the moment of inertia for the first component 1202, and "$I_{IIIx}$" is the moment of inertia for the cavity 1210.

$$I_{Ix} = \frac{a^3 b}{3} \qquad \text{Equation (23)}$$

where "$I_{Ix}$" is the moment of inertia of the first component 1202 and the cavity 1210, "a" is the maximum height of the component 1202 along the "Y-axis" 1206, and "b" is the maximum length of the component 1202 along the "X-axis" 1208.

$$I_{IIIx} = \frac{A^3 B}{12} + ABC_y^2 \qquad \text{Equation (24)}$$

where "$I_{IIIx}$" is the moment of inertia for the cavity 1210, "A" is the length of the cavity 1210 along the "Y-axis" 1206, "B" is the length of the cavity 1210 along the "X-axis" 1208, and "$C_y$" is the distance from the "Y-axis" 1206 to the centroid 1212.

$$I_{IIx} = I_{Ix} - I_{IIIx} \qquad \text{Equation (25)}$$

where "$I_{Ix}$" is the moment of inertia of the first component 1202 and the cavity 1210, "$I_{IIx}$" is the moment of inertia for the first component 1202, and "$I_{IIIx}$" is the moment of inertia for the cavity 1210.

Substituting Equation (23) and Equation (24) into Equation (25) algebraically provides Equation (26) and Equation (27).

$$I_{IIx} = \frac{a^3 b}{3} - \frac{A^3 B}{12} - ABC_y^2 \qquad \text{Equation (26)}$$

where "$I_{IIx}$" is the moment of inertia of the first component 1202, "a" is the maximum height of the component 1202 along the "Y-axis" 1206, "b" is the maximum length of the component 1202 along the "X-axis" 1208, "A" is the length of the cavity 1210 along the "Y-axis" 1206, "B" is the length of the cavity 1210 along the "X-axis" 1208, and "$C_y$" is the distance from the "Y-axis" 1206 to the centroid 1212.

$$I_{IIx} = \frac{a^3 b}{3} - \frac{a^3 b}{12} f_a^3 f_b - a^3 b f_a f_b f_c^2 \qquad \text{Equation (27)}$$

where "a" is the maximum height of the component 1202 along the "Y-axis" 1206, "b" is the maximum length of the component 1202 along the "X-axis" 1208, "$f_a$" is the ratio of the cavity height to the first component height, "$f_b$" is the ratio of the cavity height to the component height, and "$f_0$" is the ratio of "$C_y$" to the first component height.

Equation (27) can be further simplified into Equation (28).

$$I_{IIX} = \frac{a^3 b}{3}\left(1 - \frac{1}{4} f_a^3 f_b - 3 f_a f_b f_c^2\right) \qquad \text{Equation (28)}$$

where "$f_a$" is the ratio of the cavity height to the first component height, "$f_b$" is the ratio of the cavity height to the component height, and "$f_c$" is the ratio of "$C_y$" to the first component height.

$$I_{IIc} = I_{IIx} - A_{II}(y_c)^2 \qquad \text{Equation (29)}$$

where "$I_{IIc}$" is the moment of inertia of the first component relative to its centroid, "$I_{IIx}$" is the moment of inertia for the first component 1202, "$A_{II}$" is the area of the first component 1202, and "$y_c$" is the distance of the centroid 1210 from the "X-axis" 1208.

$$= \frac{a^3 b}{3}\left(1 - \frac{1}{4} f_a^3 f_b - 3 f_a f_b f_c^2\right) - ab(1 - f_a f_b)\left[\frac{a(1 - 2 f_a f_b f_c)^2}{2(1 - f_a f_b)}\right] \qquad \text{Eq. (30)}$$

where "a" is the maximum height of the component 1202 along the "Y-axis" 1206, "b" is the maximum length of the component 1202 along the "X-axis" 1208, "$f_a$" is the ratio of the cavity height to the first component height, "$f_b$" is the ratio of the cavity height to the component height, and "$f_c$" is the ratio of "$C_y$" to the first component height.

$$= \frac{a^3 b}{12(1 - f_a f_b)}[1 + f_a^4 f_b^2 - f_a^3 f_b + 4 f_a f_b (3 f_c - 3 f_c^2 - 1)] \qquad \text{Equation (31)}$$

where "a" is the maximum height of the component 1202 along the "Y-axis" 1206, "b" is the maximum length of the component 1202 along the "X-axis" 1208, "$f_a$" is the ratio of the cavity height to the first component height, "$f_b$" is the ratio of the cavity height to the component height, and "$f_c$" is the ratio of Cy to the first component height.

Figure 13:
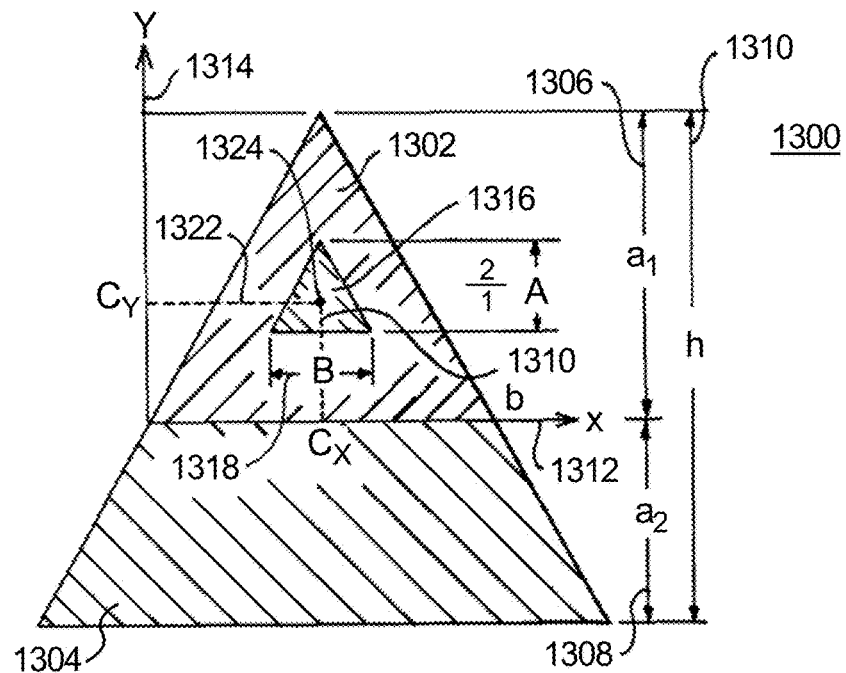
FIG. 13 depicts an exemplary embodiment of a substantially triangular cross-section, of an actuator, in accordance with material disclosed herein.

FIG. 13 depicts an exemplary embodiment of a substantially triangular cross-section, of an actuator 1300, in accordance with material disclosed herein. The actuator 1300 includes a first component 1302 and a second component 1304. For illustrative purposes only, the first component 1302 is depicted (in FIG. 13) and described below as including one cavity 1316. However, it is appreciated that in various embodiments, the first component 1302 has more than one cavity (or no cavity) and/or the second component 1304 includes at least one cavity.

The actuator 1300 includes a height 1310. Height is measured along the "Y-axis." In addition, the first component 1302 includes a maximum height 1306 (also indicated in FIG. 13 by alphanumeric character "$a_1$") and the second component includes a maximum height 1308 (also indicated in FIG. 13 by alphanumeric character "$a_2$").

Length is measured along the "X-axis" 1312. The first component 1302 includes a length 1312.

As indicated above, the first component 1302 includes cavity 1316. The cavity 1316 has a maximum length indicated by an alphanumeric character "B" and a maximum height indicated by an alphanumeric character "A." The maximum height "A" is illustratively twice the length of the maximum length "B." The cavity 1316 includes a centroid 1324. "$C_y$" 1322 is the distance from the "Y-axis" 1314 to the centroid 1324. "$C_x$" 1318 is the distance from the "X-axis" 1312 to the centroid 1324.

$$A = f_a a \quad \text{Equation (32)}$$

where "A" is the height of the cavity 1316 along the "Y-axis" 1314, "$f_a$" is the ratio of the cavity height to the first component height, and "a" is the maximum height of the first component 1302 along the "Y-axis" 1314.

$$B = f_b b \quad \text{Equation (33)}$$

where "B" is the length of the cavity 1316 along the "X-axis" 1312, "$f_b$" is the ratio of the cavity length to the first component length, and "b" is the maximum length of the component 1302 along the "X-axis" 1312.

$$C_y = f_c a \quad \left( \frac{A}{3} < C_y < a - \frac{2A}{3} \right) \quad \text{Equation (34)}$$

where, $(0 < f_a, f_b < 1)$ and $\frac{f_a}{3} < f_c < \left(1 - \frac{2 f_a}{3}\right)$ where "$C_y$" 1322 is the distance from the "Y-axis" 1314 to the centroid 1324, "$f_c$" is the ratio of Cy to the first component height, "a" is the maximum height of the component 1202 along the "Y-axis" 1206, "A" is the height of the cavity 1316 along the "Y-axis" 1314, "$f_a$" is the ratio of the cavity height to the first component height, and "$f_b$" is the ratio of the cavity height to the component height.

$$A_I = \frac{ab}{2} \quad \text{Equation (35)}$$

where "$A_I$" is the area of the upper component 1302, "a" is the maximum height of the component 1302 along the "Y-axis" 1314, and "b" is the maximum length of the first component 1302 along the "X-axis" 1312.

$$A_{III} = \frac{AB}{2} \quad \text{Equation (36)}$$

where "$A_{III}$" is area of the cavity 1316, "A" is the height of the cavity 1316 along the "Y-axis" 1314, and "B" is the length of the cavity 1316 along the "X-axis" 1312.

$$A_{II} = A_I - A_{III} = \frac{ab - AB}{2} = \frac{ab - f_a a f_b b}{2} = \frac{ab(1 - f_a f_b)}{2} \quad \text{Equation (37)}$$

where "$A_{II}$" is the area of the first component 1302, "$A_I$" is the area of the first component 1302 and the cavity 1316, "$A_{III}$" is area of the cavity 1316, "a" is the maximum height of the component 1302 along the "Y-axis" 1314, "b" is the maximum length of the component 1302 along the "X-axis" 1312, "A" is the height of the cavity 1316 along the "Y-axis" 1314, "B" is the length of the cavity 1316 along the "X-axis" 1312, "$f_a$" is the ratio of the cavity height to the first component height, and "$f_b$" is the ratio of the cavity height to the component height.

$$I_{Ix} = I_{IIx} + I_{IIIx} \quad \text{Equation (38)}$$

where "$I_{Ix}$" is the moment of inertia of the first component 1302 and the cavity 1316, "$I_{IIx}$" is the moment of inertia for the first component 1302, and "$I_{IIIx}$" is the moment of inertia for the cavity 1316.

$$I_{Ix} = \frac{a^3 b}{12} \quad \text{Equation (39)}$$

where "$I_{Ix}$" is the moment of inertia of the first component 1302 and the cavity 1316, "a" is the maximum height of the component 1302 along the "Y-axis" 1314, and "b" is the maximum length of the component 1302 along the "X-axis" 1312.

$$I_{IIIx} = \frac{A^3 B}{36} + \frac{AB}{2} C_y^2 \quad \text{Equation (40)}$$

where "$I_{IIIx}$" is the moment of inertia for the cavity 1316, "A" is the height of the cavity 1316 along the "Y-axis" 1314, "B" is the length of the cavity 1316 along the "X-axis" 1312, and "$C_y$" is the distance from the "Y-axis" 1314 to the centroid 1324.

$$I_{IIx} = I_{Ix} - I_{IIIx} \quad \text{Equation (41)}$$

where "$I_{IIx}$" is the moment of inertia for the first component 1302, "$I_{Ix}$" is the moment of inertia of the first component 1302 and the cavity 1316, and "$I_{IIIx}$" is the moment of inertia for the cavity 1316.

Substituting Equation (39) and Equation (40) into Equation (41) algebraically provides Equation (42), Equation (43), and Equation (44).

$$= \frac{a^3 b}{12} - \frac{A^3 B}{36} - \frac{AB}{2} C_y^2 \quad \text{Equation (42)}$$

where "a" is the maximum height of the component 1302 along the "Y-axis" 1314, "b" is the maximum length of the component 1302 along the "X-axis" 1312, "A" is the height of the cavity 1316 along the "Y-axis" 1314, "B" is the length of the cavity 1316 along the "X-axis" 1312, and "$C_y$" is the distance from the "Y-axis" 1314 to the centroid 1324.

$$= \frac{a^3 b}{12} - \frac{a^3 b}{36} f_a^3 f_b - \frac{1}{2} a^3 b f_a f_b f_c^2 \qquad \text{Equation (43)}$$

where "a" is the maximum height of the component 1302 along the "Y-axis" 1314, "b" is the maximum length of the component 1302 along the "X-axis" 1312, "$f_a$" is the ratio of the cavity height to the first component height, "$f_b$" is the ratio of the cavity height to the component height, and "$f_c$" is the ratio of "$C_y$" to the first component height.

$$= \frac{a^3 b}{12}\left(1 - \frac{1}{3} f_a^3 f_b - 6 f_a f_b f_c^2\right) \qquad \text{Equation (44)}$$

where "a" is the maximum height of the component 1302 along the "Y-axis" 1314, "b" is the maximum length of the component 1302 along the "X-axis" 1312, "$f_a$" is the ratio of the cavity height to the first component height, "$f_b$" is the ratio of the cavity height to the component height, and "$f_c$" is the ratio of "$C_y$" to the first component height.

$$y_c = \frac{\frac{ab}{2}\left(\frac{a}{3}\right) - \frac{AB}{2} C_y}{\frac{ab}{2} - \frac{AB}{2}} = \frac{a(1 - 3 f_a f_b f_c)}{3(1 - f_a f_b)} \qquad \text{Equation (45)}$$

where "a" is the maximum height of the component 1302 along the "Y-axis" 1314, "b" is the maximum length of the component 1302 along the "X-axis" 1312, "A" is the height of the cavity 1316 along the "Y-axis" 1314, "B" is the length of the cavity 1316 along the "X-axis" 1312, "C)" is the distance from the "Y-axis" 1314 to the centroid 1324, "$f_a$" is the ratio of the cavity height to the first component height, "$f_b$" is the ratio of the cavity height to the component height, and "$f_c$" is the ratio of "$C_y$" to the first component height.

For example, in Equation (45)

$$\text{when } f_c = \frac{1}{3}, \text{ then } y_c = \frac{a}{3}$$

$$I_{IIc} = I_{IIx} - A_{II}(y_c)^2 \qquad \text{Equation (46)}$$

where "$I_{IIc}$" is the moment of intertia of the first component relative to its centroid, "$I_{IIx}$" is the moment of inertia for the first component 1302, "$A_{II}$" is the area of the first component 1302, and "$y_c$" is the distance of the centroid 1324 from the "X-axis" 1312.

$$I_{IIc} = \qquad \text{Eq. (47)}$$
$$\frac{a^3 b}{12}\left(1 - \frac{1}{3} f_a^3 f_b - 6 f_a f_b f_c^2\right) - \left[\frac{ab(1 - f_a f_b)}{2}\right]\left(\frac{a(1 - 3 f_a f_b f_c)}{3(1 - f_a f_b)}\right)^2$$

where "$I_{IIc}$" is the moment of intertia of the first component relative to its centroid, "a" is the maximum height of the component 1302 along the "Y-axis" 1314, "b" is the maximum length of the component 1302 along the "X-axis" 1312, "$f_a$" is the ratio of the cavity height to the first component height, "$f_b$" is the ratio of the cavity height to the component height, and "$f_c$" is the ratio of "$C_y$" to the first component height.

$$I_{IIc} = \qquad \text{Equation (48)}$$
$$\frac{a^3 b}{36(1 - f_a f_b)}[1 + f_a^4 f_b^2 - f_a^3 f_b + 3 f_a f_b (4 f_c - 6 f_c^2 - 1)]$$

where "$I_{IIc}$" is the moment of intertia of the first component relative to its centroid, "a" is the maximum height of the component 1302 along the "Y-axis" 1314, "b" is the maximum length of the component 1302 along the "X-axis" 1312, "$f_a$" is the ratio of the cavity height to the first component height, "$f_b$" is the ratio of the cavity height to the component height, and "$f_c$" is the ratio of "$C_y$" to the first component height.

Upon substituting the above, the equivalent equation to Equation (8) becomes:

$$\frac{1}{\rho} = \frac{72(\alpha_2 - \alpha_1)(t - t_0)}{h\left\{\left(39 + 2\frac{U}{L}\right) + \frac{2}{3}n\frac{U}{L} + \frac{26}{3}\frac{1}{n}\frac{1}{L}\right\}} \qquad \text{Equation (49)}$$

where "

"$\frac{1}{\rho}$"

is the radius of curvature of a cross-section of 1300, "h" is the total height of the cross-section 1300, "$\alpha_2$" is the coefficient of thermal expansion for component 1304, "$\alpha_1$" is the coefficient of thermal expansion for component 1302, "$t - t_o$" is the change in temperature, "n" is the ratio of the Young's moduli of the components 1302 and 1304; and "U" and "L" are functions of the size and location of the cavity 1316:

$$U = [1 + f_a^4 f_b^2 - f_a^3 f_b + 3 f_a f_b (4 f_c - 6 f_c^2 - 1)] \qquad \text{Equation (50)}$$

where "$f_a$" is the ratio of the cavity height to the first component height, "$f_b$" is the ratio of the cavity height to the component height, and "$f_c$" is the ratio of "$C_y$" to the first component height.

$$L = (1 - f_a f_b) \qquad \text{Equation (51)}$$

where "$f_a$" is the ratio of the cavity height to the first component height, "$f_b$" is the ratio of the cavity height to the component height, and "$f_c$" is the ratio of "$C_y$" to the first component height.

for instance, in the case where $$f_a = f_b = \frac{1}{3} \text{ and } f_c = \frac{1}{2},$$

$$\frac{1}{\rho} = \frac{72(\alpha_2 - \alpha_1)(t - t_0)}{h\left\{41 + 0.7n + 11\frac{1}{n}\right\}} \quad \text{Equation (52)}$$

where

"$\frac{1}{\rho}$"

is the radius of curvature of a cross-section of 1300, "$\alpha_2$" is the coefficient of thermal expansion for component 1304, "$\alpha_1$" is the coefficient of thermal expansion for component 1302, "$t-t_o$" is the change in temperature, "h" is the total height of the cross-section 1300, and "n" is the ratio of the Young's moduli of the components 1302 and 1304

Figure 14:
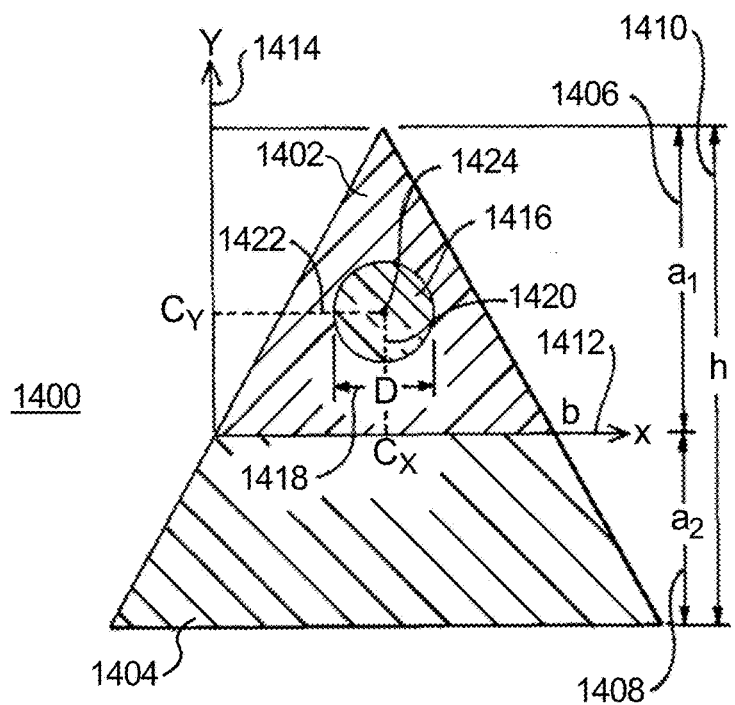
FIG. 14 depicts an exemplary embodiment of a substantially triangular cross-section, of an actuator, in accordance with material disclosed herein.

In various embodiments, a component has a shape different than a cavity contained within the component. FIG. 14 depicts an illustrative example, of a component having a shape (e.g., a substantially triangular shape) different than a cavity (e.g., a substantially circular shape) within the component.

Specifically, FIG. 14 depicts an exemplary embodiment of a substantially triangular cross-section, of an actuator 1400, in accordance with material disclosed herein. The actuator 1400 includes a first component 1402 and a second component 1404. For illustrative purposes only, the first component 1402 is depicted (in FIG. 14) and described below as including one cavity 1416. However, it is appreciated that in various embodiments, the first component 1402 has more than one cavity (or no cavity) and/or the second component 1404 includes at least one cavity.

The actuator 1400 includes a height 1410. Height is measured along the "Y-axis" 1414. In addition, the first component 1402 includes a maximum height 1406 (also indicated in FIG. 14 by alphanumeric character "$a_1$") and the second component includes a maximum height 1408 (indicated in FIG. 14 by alphanumeric character "$a_2$").

Length is measured along the "X-axis" 1412. The first component 1402 includes a length indicated by alphanumeric character "b."

As indicated above, the first component 1402 includes cavity 1416. The cavity 1416 includes a centroid 1424. The centroid 1416 has a diameter "d" 1420. "$C_y$" 1422 is the distance from the "Y-axis" 1414 to the centroid 1424. "$C_x$" 1420 is the distance from the "X-axis" 1412 to the centroid 1324.

$$D = f_a a \quad \text{Equation (53)}$$

where "D" is the diameter of the cavity 1416, "$f_a$" is the ratio of the cavity height to the first component height, and "a" is the maximum height of the first component 1402.

$$C_y = f_c a \left(\frac{D}{2} < C_y < a - \frac{D}{2}\right) \quad \text{Equation (54)}$$

where "$C_y$" 1422 is the distance from the "Y-axis" 1414 to the centroid 1424, "$f_c$" is the ratio of Cy to the first component height, "a" is the maximum height of the component 1402 along the "Y-axis" 1414, and "D" is the diameter of the cavity 1416.

$$\text{where, } (0 < f_a < 1) \text{ and } \frac{f_a}{2} < f_c < a\left(1 - \frac{f_a}{2}\right) \quad \text{Equation (55)}$$

where "$f_a$" is the ratio of the cavity height to the first component height and "$f_c$" is the ratio of "$C_y$" to the first component height.

$$A_I = \frac{ab}{2} \quad \text{Equation (56)}$$

where "$A_I$" is the area of the first component 1402, "a" is the maximum height of the component 1402 along the "Y-axis" 1414, and "b" is the maximum length of the first component 1402 along the "X-axis" 1412.

$$A_{III} = \frac{\pi D^2}{4} \quad \text{Equation (57)}$$

where "$A_{III}$" is area of the cavity 1402, "$\pi$" is the circumference of a circle (i.e., the circumference of cavity 1416), and "D" is the diameter of the cavity 1416.

$$A_{II} = A_I - A_{III} = \frac{ab}{2} - \frac{\pi D^2}{2} = \frac{ab}{2} - \frac{\pi}{4}(f_a a)^2 \quad \text{Equation (58)}$$

where "$A_{II}$" is the area of the first component 1402, "$A_I$" is the area of the first component 1402 and the cavity 1416, "$A_{III}$" is area of the cavity 1416, "a" is the maximum height of the component 1402 along the "Y-axis" 1414, "b" is the maximum length of the component 1402 along the "X-axis" 1412, "$\pi$" is the circumference of a circle (i.e., the circumference of cavity 1416), "D" is the diameter of the cavity 1416, and "$f_a$" is the ratio of the cavity height to the first component height.

$$A_{II} = \frac{ab}{2} - \frac{\pi a^2}{4} f_a^2 = \frac{a}{2}\left(b - \frac{\pi a f_a^2}{2}\right) \quad \text{Equation (59)}$$

where "$A_{II}$" is the area of the first component 1402, "a" is the maximum height of the component 1402 along the "Y-axis" 1414, "b" is the maximum length of the component 1402 along the "X-axis" 1412, "$\pi$" is the circumference of a circle (i.e., the circumference of cavity 1416), and "$f_a$" is the ratio of the cavity height to the first component height.

$$I_{Ix} = \frac{a^3 b}{12} \quad \text{Equation (60)}$$

where "$I_{Ix}$" is the moment of inertia of the first component 1402 and the cavity 1416, "a" is the maximum height of the component 1402 along the "Y-axis" 1414, and "b" is the maximum length of the component 1402 along the "X-axis" 1412.

$$I_{IIIc} = \frac{\pi D^4}{64} \quad \text{Equation (61)}$$

where "$I_{IIIc}$" is the moment of inertia of the cavity with respect to the cavity centroid and "D" is the diameter of the cavity 1416.

$$I_{IIIx} = I_{IIIc} + A_{III}(C_y)^2 = \frac{\pi D^4}{64} + \frac{\pi D^2}{4}(f_c a)^2 = \pi a^4 \left( \frac{f_a^4 + 16 f_a^2 f_c^2}{64} \right) \quad \text{Eq. (62)}$$

where "$I_{IIIx}$" is the moment of inertia for the cavity 1416, "$I_{IIIc}$" is the moment of inertia of the cavity with respect to the cavity centroid, "$A_{III}$" is area of the cavity 1402, "$C_y$" is the distance from the "Y-axis" 1414 to the centroid 1424, "π" is the circumference of a circle (i.e., the circumference of cavity 1416), "D" is the diameter of the cavity 1416, "$f_c$" is the ratio of "$C_y$" to the first component height, "a" is the maximum height of the component 1402 along the "Y-axis" 1414, and "$f_a$" is the ratio of the cavity height to the first component height.

$$I_{IIx} = I_{Ix} - I_{IIIx} = \frac{a^3 b}{12} - \pi a^4 \left( \frac{f_a^4 + 16 f_a^2 f_c^2}{64} \right) \quad \text{Equation (63)}$$

where "$I_{IIx}$" is the moment of inertia for the first component 1302, "$I_{Ix}$" is the moment of inertia of the first component 1402 and the cavity 1416, "$I_{IIIx}$" is the moment of inertia for the cavity 1416, "a" is the maximum height of the component 1402 along the "Y-axis" 1414, "b" is the maximum length of the component 1402 along the "X-axis" 1412 "it" is the circumference of a circle (i.e., the circumference of cavity 1416), "D" is the diameter of the cavity 1416, "$f_a$" is the ratio of the cavity height to the first component height, "$f_c$" is the ratio of "$C_y$" to the first component height.

$$y_c = \frac{\frac{ab}{2}\left(\frac{a}{3}\right) - \frac{\pi D^2}{4} C_y}{\frac{ab}{2} - \frac{\pi D^2}{4}} = \frac{2ab - 3\pi a^2 f_a^2 f_c}{6b - 3\pi a f_a^2} \quad \text{Equaiton (64)}$$

where "$y_c$" is the distance of the centroid 1424 from the "X-axis" 1412, "a" is the maximum height of the component 1402 along the "Y-axis" 1414, "b" is the maximum length of the component 1402 along the "X-axis" 1412, "π" is the circumference of a circle (i.e., the circumference of cavity 1416), "D" is the diameter of the cavity 1416, "$C_y$" 1422 is the distance from the "Y-axis" 1414 to the centroid 1424, "$f_a$" is the ratio of the cavity height to the first component height, and "$f_c$" is the ratio of "$C_y$" to the first component height.

$$\text{when } f_a = 0, \text{ then } y_c = \frac{a}{3}$$

Figure 15:
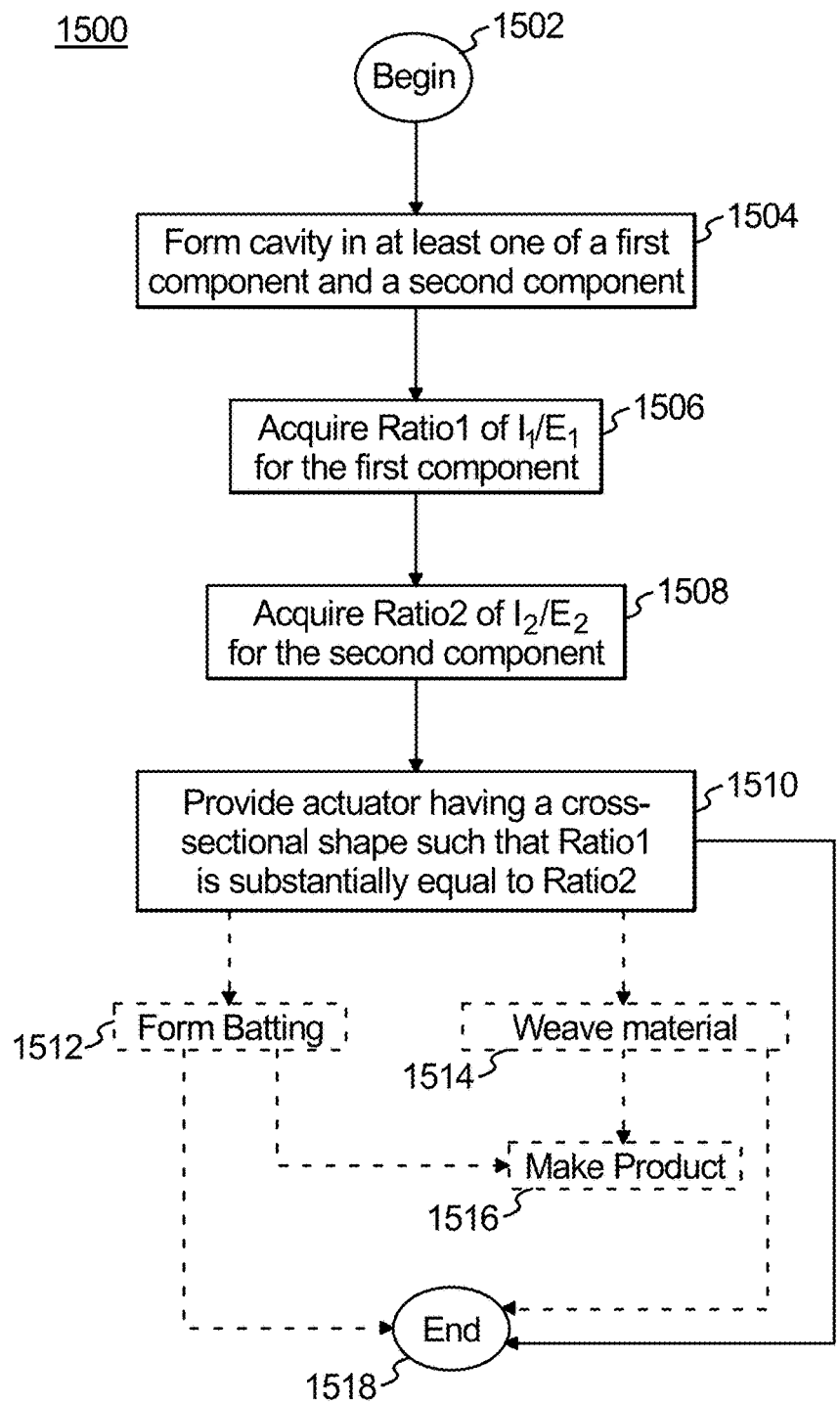
FIG. 15 depicts an exemplary embodiment of a method in accordance with material disclosed herein.

FIG. 15 depicts an exemplary embodiment of a method 1500 in accordance with material disclosed herein. The method 1550 begins at step 1502 and proceeds towards step 1504.

At step 1504, form at least one cavity in a first component and/or a second component. An overall size is selected for an actuator. As the size of the actuator is decreased, the actuator will have an ability to bend greater. As indicated above, the cavity (or cavities when there are multiple cavities) can have various shapes (e.g., a substantially rectangular or substantially triangular shape). After the cavity (or cavities when there are multiple cavities) is formed, the method 1500 proceeds towards step 1506.

At step 1506, a ratio1

$$\frac{I_1}{E_1}$$

(i.e., the ratio of the moment of inertia to the Young's Modulus) for the first component is acquired. A rate at which the first component is extruded from the die, is in accordance with ratio1. It follows that the rate at which the first component is extruded also depends upon the material used for the first component because the moment of inertia and the Young's Modulus for the second component are specific to the material used to make the second component. Thereafter the method 1500 proceeds towards step 1508.

At step 1508, a ratio2

$$\frac{I_2}{E_2}$$

(i.e., the ratio of the moment of inertia to the Young's Modulus) for the second component is acquired. A rate at which the first component is extruded from the die, is in accordance with ratio2. It also follows that the rate at which the second component is extruded also depends upon the material used for the second component because the moment of inertia and the Young's Modulus for the second component are specific to the material used to make the second component. Thereafter the method 1500 proceeds towards step 1510.

At step 1510, an actuator is formed/provided that includes the first component and the second component. The actuator is in the form of fiber. The actuator has a cross-sectional where $$\frac{I_1}{E_1}$$

of the first component is substantially equal $$\frac{I_2}{E_2}$$

of the second component. In various embodiments, $I_1+I_2$ is equal to a fixed total value. Thereafter the method 1500 proceeds to and ends at step 1518.

In various embodiments, the method 1500 includes optional steps 1512, 1514, and 1516.

For example, in one embodiment, after step 1510 the method 1500 proceeds to optional step 1512. At optional step 1512 the actuator is used to form batting material. Thereafter, the method 1500 proceeds to and ends at step 1518. Alternatively, after optional step 1512, the method 1500 proceeds to step 1516. At step 1516, the batting is used to make a product (e.g., the batting is placed between two layers of material as an insulator).

As another example, in another embodiment of the method 1500, after step 1510 the method 1500 proceeds towards step 1514. At step 1514, the actuator is used to make a weave material. After step 1514, the method 1500 proceeds to and ends at step 1518. In alternative embodiments, after step 1514, the method 1500 proceeds to step 1516. At step 1516, the weave material is used to make a product. After step 1516, the method 1500 proceeds to and ends at step 1518.

Figure 16:
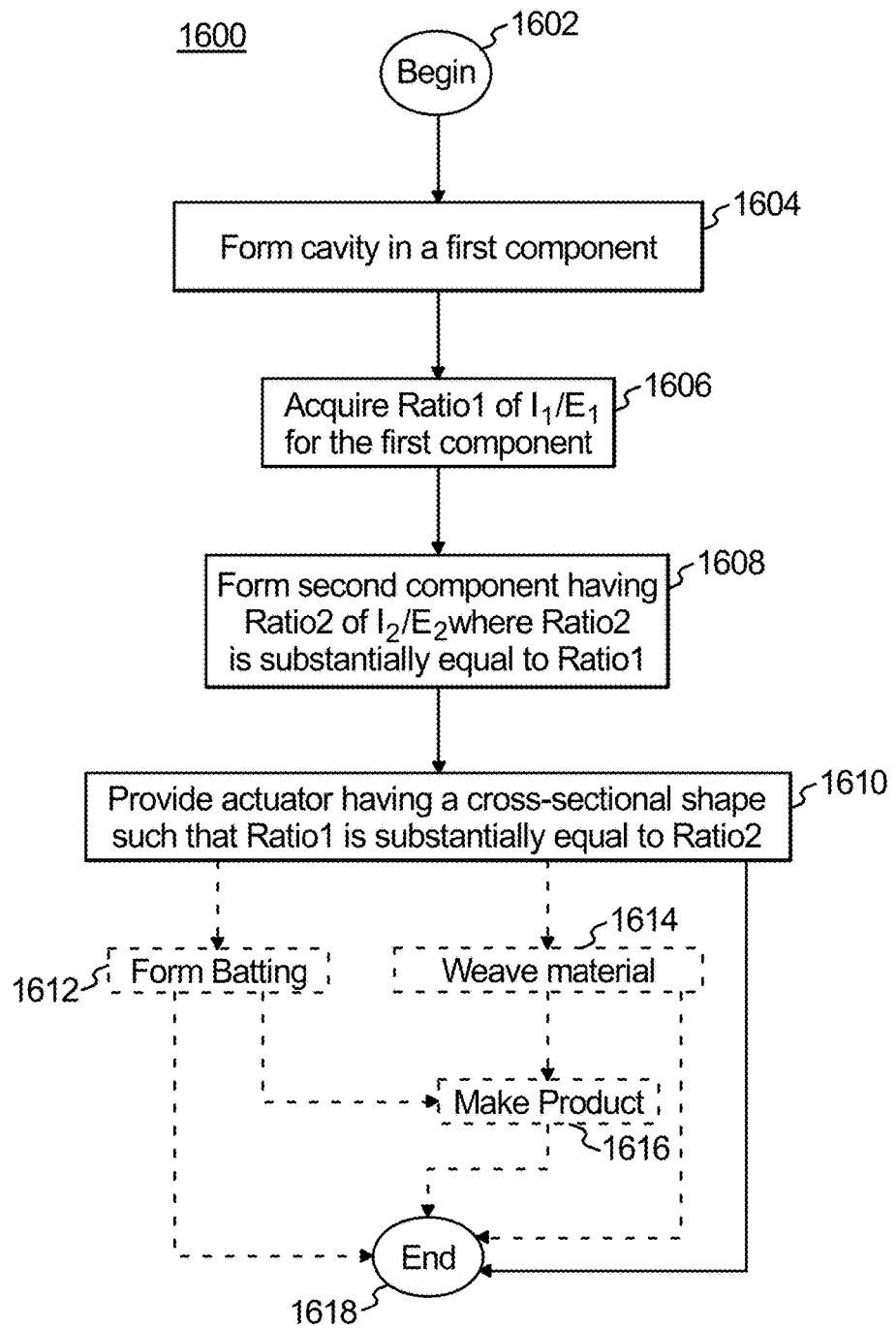
FIG. 16 depicts an exemplary embodiment of a method in accordance with material disclosed herein.

FIG. 16 depicts an exemplary embodiment of a method 1600 in accordance with material disclosed herein. The method 1600 begins at step 1602 and proceeds towards step 1604.

At step 1604, for a predetermined moment of inertia a first component is selected and formed to have at least one cavity. Thereafter, the method 1600 proceeds towards step 1604.

At step 1604, a ratio1

$$\frac{I_1}{E_1}$$

(i.e., the ratio of the moment of inertia to the Young's Modulus) for the first component is acquired. Thereafter, the method 1600 proceeds towards step 1608.

At step 1608, a second component is formed having a ratio2

$$\frac{I_2}{E_2}$$

(i.e., the ratio of the moment of inertia to the Young's Modulus) that is substantially equal to the ratio1

$$\frac{I_1}{E_1}$$

of the first component (acquired in step 1604). Thereafter the method 1600 proceeds towards step 1610.

At step 1610, an actuator is formed from the first component and the second component. The extrusion rates of the first component and the second component so that ratio1 is substantially equal to ratio 2. The formed actuator has a cross-sectional shape such that ratio1 is substantially equal to ratio2. After step 1610, the method 1600 proceeds towards and ends at step 1610.

In various embodiments, the method 1600 includes steps other than those describe above. For example, in one embodiment, after step 1610 the method 1600 proceeds towards optional step 1612. At optional step 1612, the actuator is used to form batting material. After optional step 1612, the method 1600 proceeds towards and end at step 1618. In yet other embodiments of method 1600, after optional step 1612, the method 1600 proceeds towards optional step 1616. At optional step 1616 a product is made using the batting material. After optional step 1616, the method proceeds towards and ends at step 1618.

In various embodiments of the method 1600, after step 1610, the method 1600 proceeds towards optional step 1614. At optional step 1614, the actuator is used to form a weave material. In various embodiments, after optional step 1614, the method 1600 proceeds towards and ends at step 1618. In yet other embodiments, after optional step 1614, the method 1600 proceeds towards optional step 1616. At optional step 1616 a product is made using the weave material. After optional step 1616, the method 1600 proceeds towards and ends at step 1618.

Figure 17:
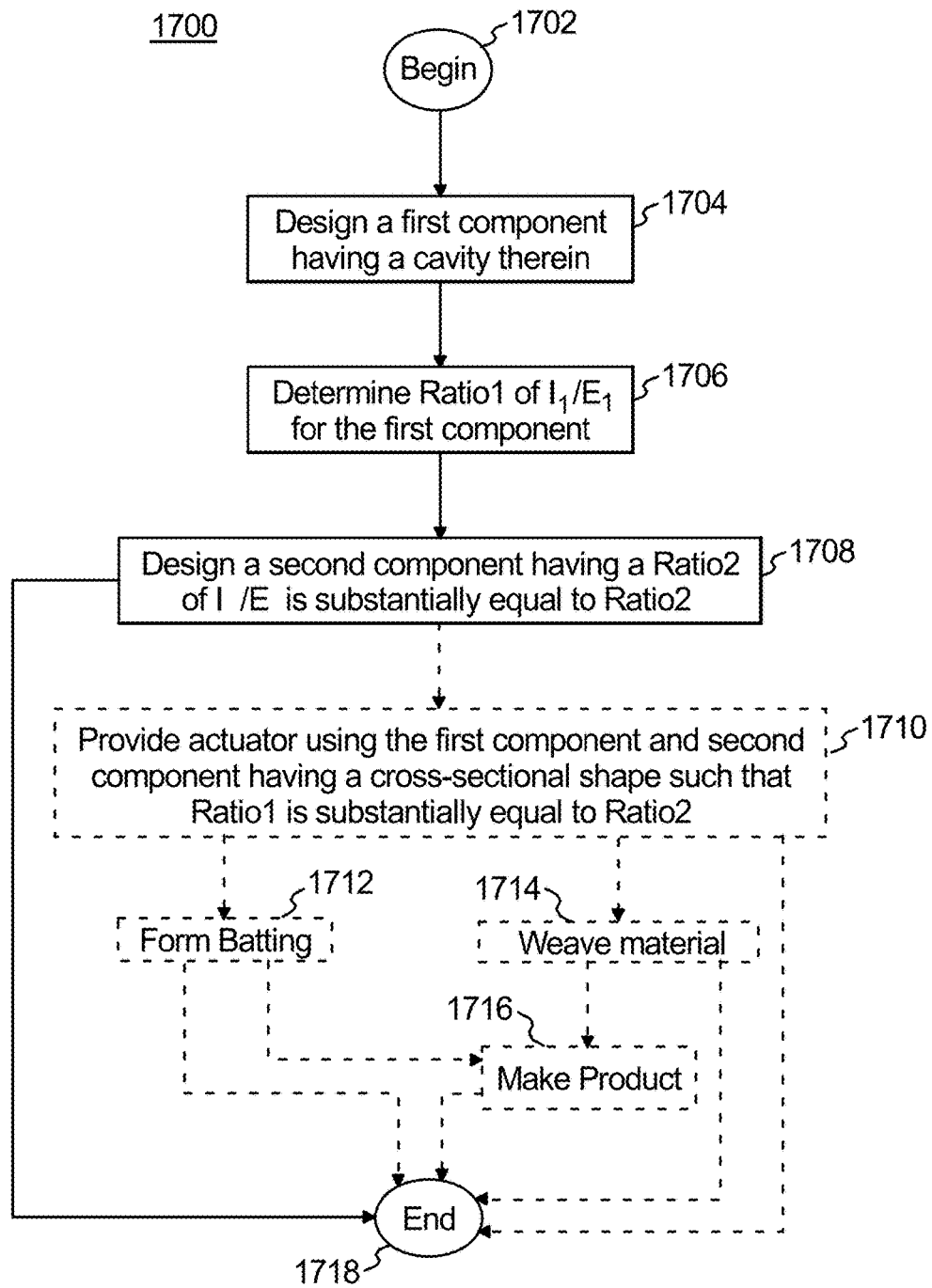
FIG. 17 depicts an exemplary embodiment of a method in accordance with material disclosed herein.

FIG. 17 depicts an exemplary embodiment of a method 1700 in accordance with material disclosed herein. Method 1700 begins at step 1702 and proceeds towards step 1704.

At step 1704, a first component is designed so that it has at least one cavity therein. Thereafter, the method 1700 proceeds towards step 1706.

At step 1706, a Ratio1

$$\frac{I_1}{E_1}$$

for the first component is acquired. After the ratio1 is acquired for the design of the first component, the method 1700 proceeds towards step 1708.

At step 1708, a second component is designed having a Ratio2

$$\frac{I_2}{E_2}$$

(i.e., the ratio of the moment of inertia to the Young's Modulus) that is substantially equal to the ratio1

$$\frac{I_1}{E_1}$$

of the first component. In various embodiments, the design of the second component includes at least one cavity. After designing the second component, the method 1700 proceeds to and ends at step 1718.

In other embodiments, the method 1700 includes optional steps. For example, after step 1708, the method 1700 proceeds towards optional step 1710.

At optional step 1710, an actuator is formed/provided that includes the first component and the second component designed in steps 1704 and 1706, respectively. The actuator has a cross-sectional shape such that Ratio1 is substantially equal to Ratio2. In one embodiment, after optional step 1710, the method 1700 proceeds to and ends at step 1718.

In other embodiments, after optional step 1710, the method 1700 proceeds to optional step 1712. At optional step 1712, the actuator is used to form batting material. After optional step 1712, the method 1700 proceeds to and ends at step 1718. In some embodiments, after optional step 1712, the method 1700 proceeds towards optional step 1716. At optional step 1716, the batting material is used to make a product. After optional step 1716, the method 1700 proceeds to and ends at step 1718.

In other embodiments, the method 1700 proceeds towards optional step 1714 after performing optional step 1710. At optional step 1714 the actuator is used to produce a woven material. After optional step 1714, the method 1700 proceeds towards optional step 1716. At optional step 1716, the woven material is used to make a product. After optional step 1716, the method 1700 proceeds to and ends at step 1718.

In various embodiments, an actuator can be designed by one entity and actually manufactured by another entity.

As used herein, the terms "having," "containing," "including," "comprising" and the like are open ended terms that indicate the presence of stated elements or features, but do not preclude additional elements or features. The articles "a," "an," and "the" are intended to include the plural as well as the singular, unless the context clearly indicates otherwise.

While the foregoing is directed to embodiments of the present invention, other and further embodiments of the invention may be devised without departing from the basic scope thereof, and the scope thereof is determined by the claims that follow.

We claim:

1. A method for configuring an actuator to bend a predetermined amount for a change in ambient conditions, comprising:
    determining a desired amount of bending for an actuator based on ambient conditions;
    selecting a first component having a first ratio of a modulus of inertia to a Young's Modulus for said first component;
    selecting a second component having a second ratio of a modulus of inertia to a Young's Modulus for said second component; and
    combining said first component with said second component to form the actuator wherein said actuator includes a cross-sectional shape having said first ratio substantially equal to said second ratio;
    whereby the actuator is configured to bend the desired amount for a change in ambient conditions; and
    wherein at least one of said first component and said second component is configured to include at least one cavity therein.

2. The method of claim 1 wherein said combining comprises one of extruding, machining, spinning, adhering, and cross-linking of said first component and said second component.

3. The method of claim 1 wherein said cross-sectional shape is one of a substantially triangular cross-section, a substantially rectangular cross-section, and a substantially circular cross-section.

4. The method of claim 1 further comprising forming said actuator into one of a suture, a batting, a thermostat needle, a spun fiber, and a gel.

5. The method of claim 1 further comprising forming said actuator into a spun fiber and, in turn, forming one of a batting material and a woven material from said spun fiber.

6. The method of 5 further comprising making a product from said one of said batting material and said woven material.

7. A method for making an actuator that is configured to bend a predetermined amount for a change in ambient conditions, comprising:
    determining a desired amount of bending for an actuator based on ambient conditions;
    selecting a first polymer for injecting through a dye, wherein
    said first polymer has a first coefficient of thermal expansion (CTE), and
    a first ratio of a modulus of inertia to a Young's Modulus, and
    selecting a second polymer for injecting, simultaneously to said injection of said first polymer, through said dye, wherein
    said second polymer has a second CTE higher than said first CTE, and
    a second ratio of a modulus of inertia to a Young's Modulus;
    extruding the actuator from said dye, wherein said actuator includes a cross-sectional shape having said first ratio substantially equal to said second ratio and whereby the actuator is configured to bend the desired amount for a change in ambient conditions;
    and wherein at least one of said first component and said second component includes at least one cavity therein.

8. The method of claim 7 wherein said actuator is formed into one of a suture, a batting, a thermostat needle, a spun fiber, and a gel.

9. The method of claim 7 wherein said actuator is formed into a spun fiber and, in turn, forming one of a batting material and a woven material from said spun fiber.

10. The method of 9 further comprising making a product from said one of said batting material and said woven material.

* * * * *